United States Patent
Lee

(10) Patent No.: US 8,254,473 B2
(45) Date of Patent: Aug. 28, 2012

(54) BIT INTERLEAVER AND METHOD OF BIT INTERLEAVING USING THE SAME

(75) Inventor: Jeong Sang Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1229 days.

(21) Appl. No.: 11/642,524

(22) Filed: Dec. 21, 2006

(65) Prior Publication Data
US 2008/0024333 A1 Jan. 31, 2008

(30) Foreign Application Priority Data
Jul. 31, 2006 (KR) .................. 10-2006-0072286

(51) Int. Cl.
*H04K 1/10* (2006.01)
*H04L 27/28* (2006.01)

(52) U.S. Cl. ..................... 375/260; 375/259

(58) Field of Classification Search ............ 370/413, 370/468; 375/130, 219, 222, 240.27, 260, 375/267, 299; 708/400–404, 511; 714/701, 714/778, 796
See application file for complete search history.

(56) References Cited

U.S. PATENT DOCUMENTS

| | | | | |
|---|---|---|---|---|
| 6,795,498 B1* | 9/2004 | Kato et al. | ............... | 375/240.01 |
| 6,915,385 B1* | 7/2005 | Leasure et al. | ............... | 711/127 |
| 7,079,480 B2* | 7/2006 | Agee | ............... | 370/204 |
| 7,511,642 B1* | 3/2009 | Han et al. | ............... | 341/81 |
| 2001/0018751 A1* | 8/2001 | Gresham | ............... | 713/401 |
| 2002/0150109 A1* | 10/2002 | Agee | ............... | 370/400 |
| 2002/0163880 A1* | 11/2002 | Matsumoto | ............... | 370/208 |
| 2002/0181638 A1* | 12/2002 | Peters | ............... | 375/372 |
| 2003/0193577 A1* | 10/2003 | Doring et al. | ............... | 348/211.99 |
| 2005/0078598 A1 | 4/2005 | Batra et al. | | |
| 2005/0152327 A1 | 7/2005 | Erhlich et al. | | |
| 2005/0213650 A1* | 9/2005 | Modlin | ............... | 375/222 |
| 2006/0164973 A1* | 7/2006 | Lee et al. | ............... | 370/208 |
| 2007/0195871 A1* | 8/2007 | Gulati et al. | ............... | 375/222 |
| 2009/0086835 A1* | 4/2009 | Han et al. | ............... | 375/260 |

OTHER PUBLICATIONS

Dave Leeper, "Overvier of MB-OFDM", WiMedia Alliance, pp. 1-15.
Chen Dana, "Design and Verification of MB-UWB PHY", Agilent Technologies.

* cited by examiner

Primary Examiner — David C. Payne
Assistant Examiner — Erin File
(74) *Attorney, Agent, or Firm* — Sughrue Mion, PLLC

(57) ABSTRACT

A bit interleaver and a bit interleaving method are provided. The bit interleaver includes delay devices which are applied with symbol interleaving and tone interleaving, and delay a bit stream output from a memory, to generate a delayed bit stream; a first multiplexer (MUX) unit which selects any one of a bit of the bit stream output from the memory and a bit of the delayed bit stream, to generate a selection bit stream; and a second MUX unit which changes an order of the selection bit stream to generate an output bit stream. Accordingly, it is possible to easily and effectively perform bit interleaving including a cyclic shift.

27 Claims, 28 Drawing Sheets

FIG. 2

| addr \ bit_order | i=0 | | | | | | i=1 | | | | | |
|---|---|---|---|---|---|---|---|---|---|---|---|---|
| | 0 | 1 | 2 | 3 | 4 | 5 | 0 | 1 | 2 | 3 | 4 | 5 |
| j=0 0 | 0 | 1 | 2 | 3 | 4 | 5 | 6 | 7 | 8 | 9 | 10 | 11 |
| 1 | 12 | 13 | 14 | 15 | 16 | 17 | 18 | 19 | 20 | 21 | 22 | 23 |
| 2 | 24 | 25 | 26 | 27 | 28 | 29 | 30 | 31 | 32 | 33 | 34 | 35 |
| 3 | 36 | 37 | 38 | 39 | 40 | 41 | 42 | 43 | 44 | 45 | 46 | 47 |
| 4 | 48 | 49 | 50 | 51 | 52 | 53 | 54 | 55 | 56 | 57 | 58 | 59 |
| j=1 0 | 60 | 61 | 62 | 63 | 64 | 65 | 66 | 67 | 68 | 69 | 70 | 71 |
| 1 | 72 | 73 | 74 | 75 | 76 | 77 | 78 | 79 | 80 | 81 | 82 | 83 |
| 2 | 84 | 85 | 86 | 87 | 88 | 89 | 90 | 91 | 92 | 93 | 94 | 95 |
| 3 | 96 | 97 | 98 | 99 | 100 | 101 | 102 | 103 | 104 | 105 | 106 | 107 |
| 4 | 108 | 109 | 110 | 111 | 112 | 113 | 114 | 115 | 116 | 117 | 118 | 119 |
| j=2 0 | 120 | 121 | 122 | 123 | 124 | 125 | 126 | 127 | 128 | 129 | 130 | 131 |
| 1 | 132 | 133 | 134 | 135 | 136 | 137 | 138 | 139 | 140 | 141 | 142 | 143 |
| 2 | 144 | 145 | 146 | 147 | 148 | 149 | 150 | 151 | 152 | 153 | 154 | 155 |
| 3 | 156 | 157 | 158 | 159 | 160 | 161 | 162 | 163 | 164 | 165 | 166 | 167 |
| 4 | 168 | 169 | 170 | 171 | 172 | 173 | 174 | 175 | 176 | 177 | 178 | 179 |
| j=3 0 | 180 | 181 | 182 | 183 | 184 | 185 | 186 | 187 | 188 | 189 | 190 | 191 |
| 1 | 192 | 193 | 194 | 195 | 196 | 197 | 198 | 199 | 200 | 201 | 202 | 203 |
| 2 | 204 | 205 | 206 | 207 | 208 | 209 | 210 | 211 | 212 | 213 | 214 | 215 |
| 3 | 216 | 217 | 218 | 219 | 220 | 221 | 222 | 223 | 224 | 225 | 226 | 227 |
| 4 | 228 | 229 | 230 | 231 | 232 | 233 | 234 | 235 | 236 | 237 | 238 | 239 |
| j=4 0 | 240 | 241 | 242 | 243 | 244 | 245 | 246 | 247 | 248 | 249 | 250 | 251 |
| 1 | 252 | 253 | 254 | 255 | 256 | 257 | 258 | 259 | 260 | 261 | 262 | 263 |
| 2 | 264 | 265 | 266 | 267 | 268 | 269 | 270 | 271 | 272 | 273 | 274 | 275 |
| 3 | 276 | 277 | 278 | 279 | 280 | 281 | 282 | 283 | 284 | 285 | 286 | 287 |
| 4 | 288 | 289 | 290 | 291 | 292 | 293 | 294 | 295 | 296 | 297 | 298 | 299 |

FIG. 3

| 0 | 3 | 6 | 9 | 12 | 15 | 18 | 21 | 24 | 27 |
|---|---|---|---|---|---|---|---|---|---|
| 30 | 33 | 36 | 39 | 42 | 45 | 48 | 51 | 54 | 57 |
| 60 | 63 | 66 | 69 | 72 | 75 | 78 | 81 | 84 | 87 |
| 90 | 93 | 96 | 99 | 102 | 105 | 108 | 111 | 114 | 117 |
| 120 | 123 | 126 | 129 | 132 | 135 | 138 | 141 | 144 | 147 |
| 150 | 153 | 156 | 159 | 162 | 165 | 168 | 171 | 174 | 177 |
| 180 | 183 | 186 | 189 | 192 | 195 | 198 | 201 | 204 | 207 |
| 210 | 213 | 216 | 219 | 222 | 225 | 228 | 231 | 234 | 237 |
| 240 | 243 | 246 | 249 | 252 | 255 | 258 | 261 | 264 | 267 |
| 270 | 273 | 276 | 279 | 282 | 285 | 288 | 291 | 294 | 297 |

} 310

| 1 | 4 | 7 | 10 | 13 | 16 | 19 | 22 | 25 | 28 |
|---|---|---|---|---|---|---|---|---|---|
| 31 | 34 | 37 | 40 | 43 | 46 | 49 | 52 | 55 | 58 |
| 61 | 64 | 67 | 70 | 73 | 76 | 79 | 82 | 85 | 88 |
| 91 | 94 | 97 | 100 | 103 | 106 | 109 | 112 | 115 | 118 |
| 121 | 124 | 127 | 130 | 133 | 136 | 139 | 142 | 145 | 148 |
| 151 | 154 | 157 | 160 | 163 | 166 | 169 | 172 | 175 | 178 |
| 181 | 184 | 187 | 190 | 193 | 196 | 199 | 202 | 205 | 208 |
| 211 | 214 | 217 | 220 | 223 | 226 | 229 | 232 | 235 | 238 |
| 241 | 244 | 247 | 250 | 253 | 256 | 259 | 262 | 265 | 268 |
| 271 | 274 | 277 | 280 | 283 | 286 | 289 | 292 | 295 | 298 |

} 320

| 2 | 5 | 8 | 11 | 14 | 17 | 20 | 23 | 26 | 29 |
|---|---|---|---|---|---|---|---|---|---|
| 32 | 35 | 38 | 41 | 44 | 47 | 50 | 53 | 56 | 59 |
| 62 | 65 | 68 | 71 | 74 | 77 | 80 | 83 | 86 | 89 |
| 92 | 95 | 98 | 101 | 104 | 107 | 110 | 113 | 116 | 119 |
| 122 | 125 | 128 | 131 | 134 | 137 | 140 | 143 | 146 | 149 |
| 152 | 155 | 158 | 161 | 164 | 167 | 170 | 173 | 176 | 179 |
| 182 | 185 | 188 | 191 | 194 | 197 | 200 | 203 | 206 | 209 |
| 212 | 215 | 218 | 221 | 224 | 227 | 230 | 233 | 236 | 239 |
| 242 | 245 | 248 | 251 | 254 | 257 | 260 | 263 | 266 | 269 |
| 272 | 275 | 278 | 281 | 284 | 287 | 290 | 293 | 296 | 299 |

| 0 | 1 | 2 | 3 | 4 | 5 | 6 | 7 | 8 | 9 |
|---|---|---|---|---|---|---|---|---|---|
| 10 | 11 | 12 | 13 | 14 | 15 | 16 | 17 | 18 | 19 |
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |
| 90 | 91 | 92 | 93 | 94 | 95 | 96 | 97 | 98 | 99 |

⎬ 410

| 0 | 1 | 2 | 3 | 4 | 5 | 6 | 7 | 8 | 9 |
|---|---|---|---|---|---|---|---|---|---|
| 10 | 11 | 12 | 13 | 14 | 15 | 16 | 17 | 18 | 19 |
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |
| 90 | 91 | 92 | 93 | 94 | 95 | 96 | 97 | 98 | 99 |

⎬ 420

| 0 | 1 | 2 | 3 | 4 | 5 | 6 | 7 | 8 | 9 |
|---|---|---|---|---|---|---|---|---|---|
| 10 | 11 | 12 | 13 | 14 | 15 | 16 | 17 | 18 | 19 |
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |
| 90 | 91 | 92 | 93 | 94 | 95 | 96 | 97 | 98 | 99 |

| 0 | 10 | 20 | 30 | 40 | 50 | 60 | 70 | 80 | 90 |
|---|----|----|----|----|----|----|----|----|----|
| 1 | 11 | 21 | 31 | 41 | 51 | 61 | 71 | 81 | 91 |
| 2 | 12 | 22 | 32 | 42 | 52 | 62 | 72 | 82 | 92 |
| 3 | 13 | 23 | 33 | 43 | 53 | 63 | 73 | 83 | 93 |
| 4 | 14 | 24 | 34 | 44 | 54 | 64 | 74 | 84 | 94 |
| 5 | 15 | 25 | 35 | 45 | 55 | 65 | 75 | 85 | 95 |
| 6 | 16 | 26 | 36 | 46 | 56 | 66 | 76 | 86 | 96 |
| 7 | 17 | 27 | 37 | 47 | 57 | 67 | 77 | 87 | 97 |
| 8 | 18 | 28 | 38 | 48 | 58 | 68 | 78 | 88 | 98 |
| 9 | 19 | 29 | 39 | 49 | 59 | 69 | 79 | 89 | 99 |

} 510

| 0 | 10 | 20 | 30 | 40 | 50 | 60 | 70 | 80 | 90 |
|---|----|----|----|----|----|----|----|----|----|
| 1 | 11 | 21 | 31 | 41 | 51 | 61 | 71 | 81 | 91 |
| 2 | 12 | 22 | 32 | 42 | 52 | 62 | 72 | 82 | 92 |
| 3 | 13 | 23 | 33 | 43 | 53 | 63 | 73 | 83 | 93 |
| 4 | 14 | 24 | 34 | 44 | 54 | 64 | 74 | 84 | 94 |
| 5 | 15 | 25 | 35 | 45 | 55 | 65 | 75 | 85 | 95 |
| 6 | 16 | 26 | 36 | 46 | 56 | 66 | 76 | 86 | 96 |
| 7 | 17 | 27 | 37 | 47 | 57 | 67 | 77 | 87 | 97 |
| 8 | 18 | 28 | 38 | 48 | 58 | 68 | 78 | 88 | 98 |
| 9 | 19 | 29 | 39 | 49 | 59 | 69 | 79 | 89 | 99 |

} 520

| 0 | 10 | 20 | 30 | 40 | 50 | 60 | 70 | 80 | 90 |
|---|----|----|----|----|----|----|----|----|----|
| 1 | 11 | 21 | 31 | 41 | 51 | 61 | 71 | 81 | 91 |
| 2 | 12 | 22 | 32 | 42 | 52 | 62 | 72 | 82 | 92 |
| 3 | 13 | 23 | 33 | 43 | 53 | 63 | 73 | 83 | 93 |
| 4 | 14 | 24 | 34 | 44 | 54 | 64 | 74 | 84 | 94 |
| 5 | 15 | 25 | 35 | 45 | 55 | 65 | 75 | 85 | 95 |
| 6 | 16 | 26 | 36 | 46 | 56 | 66 | 76 | 86 | 96 |
| 7 | 17 | 27 | 37 | 47 | 57 | 67 | 77 | 87 | 97 |
| 8 | 18 | 28 | 38 | 48 | 58 | 68 | 78 | 88 | 98 |
| 9 | 19 | 29 | 39 | 49 | 59 | 69 | 79 | 89 | 99 |

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| out0 | 89 | 88 | 87 | 86 | 85 | 84 | 83 | 82 | 81 | 80 | 0 | 1 | 2 | 3 | 4 | 5 | 6 | 7 | 8 | 9 |
| out1 | 99 | 98 | 97 | 96 | 95 | 94 | 93 | 92 | 91 | 90 | 10 | 11 | 12 | 13 | 14 | 15 | 16 | 17 | 18 | 19 |
| out2 | 69 | 68 | 67 | 66 | 65 | 64 | 63 | 62 | 61 | 60 | 20 | 21 | 22 | 23 | 24 | 25 | 26 | 27 | 28 | 29 |
| out3 | 79 | 78 | 77 | 76 | 75 | 74 | 73 | 72 | 71 | 70 | 30 | 31 | 32 | 33 | 34 | 35 | 36 | 37 | 38 | 39 |
| out4 | 49 | 48 | 47 | 46 | 45 | 44 | 43 | 42 | 41 | 40 | 40 | 41 | 42 | 43 | 44 | 45 | 46 | 47 | 48 | 49 |
| out5 | 59 | 58 | 57 | 56 | 55 | 54 | 53 | 52 | 51 | 50 | 50 | 51 | 52 | 53 | 54 | 55 | 56 | 57 | 58 | 59 |
| out6 | 29 | 28 | 27 | 26 | 25 | 24 | 23 | 22 | 21 | 20 | 60 | 61 | 62 | 63 | 64 | 65 | 66 | 67 | 68 | 68 |
| out7 | 39 | 38 | 37 | 36 | 35 | 34 | 33 | 32 | 31 | 30 | 70 | 71 | 72 | 73 | 74 | 75 | 76 | 77 | 78 | 79 |
| out8 | 9 | 8 | 7 | 6 | 5 | 4 | 3 | 2 | 1 | 0 | 80 | 81 | 82 | 83 | 84 | 85 | 86 | 87 | 88 | 89 |
| out9 | 19 | 18 | 17 | 16 | 15 | 14 | 13 | 12 | 11 | 10 | 90 | 91 | 92 | 93 | 94 | 95 | 96 | 97 | 98 | 99 |

720

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| out0 | 13 | 12 | 11 | 10 | 19 | 18 | 17 | 16 | 15 | 14 | 33 | 34 | 35 | 36 | 37 | 38 | 39 | 30 | 31 | 32 |
| out1 | 23 | 22 | 21 | 20 | 29 | 28 | 27 | 26 | 25 | 24 | 43 | 44 | 45 | 46 | 47 | 48 | 49 | 40 | 41 | 42 |
| out2 | 92 | 91 | 90 | 99 | 98 | 97 | 96 | 95 | 94 | 93 | 53 | 54 | 55 | 56 | 57 | 58 | 59 | 50 | 51 | 52 |
| out3 | 3 | 2 | 1 | 0 | 9 | 8 | 7 | 6 | 5 | 4 | 63 | 64 | 65 | 66 | 67 | 68 | 68 | 60 | 61 | 62 |
| out4 | 72 | 71 | 70 | 79 | 78 | 77 | 76 | 75 | 74 | 73 | 73 | 74 | 75 | 76 | 77 | 78 | 79 | 70 | 71 | 72 |
| out5 | 82 | 81 | 80 | 89 | 88 | 87 | 86 | 85 | 84 | 83 | 83 | 84 | 85 | 86 | 87 | 88 | 89 | 80 | 81 | 82 |
| out6 | 52 | 51 | 50 | 59 | 58 | 57 | 56 | 55 | 54 | 53 | 93 | 94 | 95 | 96 | 97 | 98 | 99 | 90 | 91 | 92 |
| out7 | 62 | 61 | 60 | 69 | 68 | 67 | 66 | 65 | 64 | 63 | 4 | 5 | 6 | 7 | 8 | 9 | 0 | 1 | 2 | 3 |
| out8 | 32 | 31 | 30 | 39 | 38 | 37 | 36 | 35 | 34 | 33 | 14 | 15 | 16 | 17 | 18 | 19 | 10 | 11 | 12 | 13 |
| out9 | 42 | 41 | 40 | 49 | 48 | 47 | 46 | 45 | 44 | 43 | 24 | 25 | 26 | 27 | 28 | 29 | 20 | 21 | 22 | 23 |

730

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| out0 | 46 | 45 | 44 | 43 | 42 | 41 | 40 | 49 | 48 | 47 | 66 | 67 | 68 | 68 | 60 | 61 | 62 | 63 | 64 | 65 |
| out1 | 56 | 55 | 54 | 53 | 52 | 51 | 50 | 59 | 58 | 57 | 76 | 77 | 78 | 79 | 70 | 71 | 72 | 73 | 74 | 75 |
| out2 | 26 | 25 | 24 | 23 | 22 | 21 | 20 | 29 | 28 | 27 | 86 | 87 | 88 | 89 | 80 | 81 | 82 | 83 | 84 | 85 |
| out3 | 36 | 35 | 34 | 33 | 32 | 31 | 30 | 39 | 38 | 37 | 96 | 97 | 98 | 99 | 90 | 91 | 92 | 93 | 94 | 95 |
| out4 | 6 | 5 | 4 | 3 | 2 | 1 | 0 | 9 | 8 | 7 | 7 | 8 | 9 | 0 | 1 | 2 | 3 | 4 | 5 | 6 |
| out5 | 16 | 15 | 14 | 13 | 12 | 11 | 10 | 19 | 18 | 17 | 17 | 18 | 19 | 10 | 11 | 12 | 13 | 14 | 15 | 16 |
| out6 | 85 | 84 | 83 | 82 | 81 | 80 | 89 | 88 | 87 | 86 | 27 | 28 | 29 | 20 | 21 | 22 | 23 | 24 | 25 | 26 |
| out7 | 95 | 94 | 93 | 92 | 91 | 90 | 99 | 98 | 97 | 96 | 37 | 38 | 39 | 30 | 31 | 32 | 33 | 34 | 35 | 36 |
| out8 | 65 | 64 | 63 | 62 | 61 | 60 | 69 | 68 | 67 | 66 | 47 | 48 | 49 | 40 | 41 | 42 | 43 | 44 | 45 | 46 |
| out9 | 75 | 74 | 73 | 72 | 71 | 70 | 79 | 78 | 77 | 76 | 57 | 58 | 59 | 50 | 51 | 52 | 53 | 54 | 55 | 56 |

FIG. 8

810
| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| mem0 | 9 | 8 | 7 | 6 | 5 | 4 | 3 | 2 | 1 | 0 | 0 | 1 | 2 | 3 | 4 | 5 | 6 | 7 | 8 | 9 |
| mem1 | 19 | 18 | 17 | 16 | 15 | 14 | 13 | 12 | 11 | 10 | 10 | 11 | 12 | 13 | 14 | 15 | 16 | 17 | 18 | 19 |
| mem2 | 29 | 28 | 27 | 26 | 25 | 24 | 23 | 22 | 21 | 20 | 20 | 21 | 22 | 23 | 24 | 25 | 26 | 27 | 28 | 29 |
| mem3 | 39 | 38 | 37 | 36 | 35 | 34 | 33 | 32 | 31 | 30 | 30 | 31 | 32 | 33 | 34 | 35 | 36 | 37 | 38 | 39 |
| mem4 | 49 | 48 | 47 | 46 | 45 | 44 | 43 | 42 | 41 | 40 | 40 | 41 | 42 | 43 | 44 | 45 | 46 | 47 | 48 | 49 |
| mem5 | 59 | 58 | 57 | 56 | 55 | 54 | 53 | 52 | 51 | 50 | 50 | 51 | 52 | 53 | 54 | 55 | 56 | 57 | 58 | 59 |
| mem6 | 69 | 68 | 67 | 66 | 65 | 64 | 63 | 62 | 61 | 60 | 60 | 61 | 62 | 63 | 64 | 65 | 66 | 67 | 68 | 68 |
| mem7 | 79 | 78 | 77 | 76 | 75 | 74 | 73 | 72 | 71 | 70 | 70 | 71 | 72 | 73 | 74 | 75 | 76 | 77 | 78 | 79 |
| mem8 | 89 | 88 | 87 | 86 | 85 | 84 | 83 | 82 | 81 | 80 | 80 | 81 | 82 | 83 | 84 | 85 | 86 | 87 | 88 | 89 |
| mem9 | 99 | 98 | 97 | 96 | 95 | 94 | 93 | 92 | 91 | 90 | 90 | 91 | 92 | 93 | 94 | 95 | 96 | 97 | 98 | 99 |

820
| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| mem0 | 3 | 2 | 1 | 0 | 9 | 8 | 7 | 6 | 5 | 4 | 3 | 4 | 5 | 6 | 7 | 8 | 9 | 0 | 1 | 2 |
| mem1 | 13 | 12 | 11 | 10 | 19 | 18 | 17 | 16 | 15 | 14 | 13 | 14 | 15 | 16 | 17 | 18 | 19 | 10 | 11 | 12 |
| mem2 | 23 | 22 | 21 | 20 | 29 | 28 | 27 | 26 | 25 | 24 | 23 | 24 | 25 | 26 | 27 | 28 | 29 | 20 | 21 | 22 |
| mem3 | 33 | 32 | 31 | 30 | 39 | 38 | 37 | 36 | 35 | 34 | 33 | 34 | 35 | 36 | 37 | 38 | 39 | 30 | 31 | 32 |
| mem4 | 43 | 42 | 41 | 40 | 49 | 48 | 47 | 46 | 45 | 44 | 43 | 44 | 45 | 46 | 47 | 48 | 49 | 40 | 41 | 42 |
| mem5 | 53 | 52 | 51 | 50 | 59 | 58 | 57 | 56 | 55 | 54 | 53 | 54 | 55 | 56 | 57 | 58 | 59 | 50 | 51 | 52 |
| mem6 | 63 | 62 | 61 | 60 | 69 | 68 | 67 | 66 | 65 | 64 | 63 | 64 | 65 | 66 | 67 | 68 | 68 | 60 | 61 | 62 |
| mem7 | 73 | 72 | 71 | 70 | 79 | 78 | 77 | 76 | 75 | 74 | 73 | 74 | 75 | 76 | 77 | 78 | 79 | 70 | 71 | 72 |
| mem8 | 83 | 82 | 81 | 80 | 89 | 88 | 87 | 86 | 85 | 84 | 83 | 84 | 85 | 86 | 87 | 88 | 89 | 80 | 81 | 82 |
| mem9 | 93 | 92 | 91 | 90 | 99 | 98 | 97 | 96 | 95 | 94 | 93 | 94 | 95 | 96 | 97 | 98 | 99 | 90 | 91 | 92 |

↖821  ↖822

830
| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| mem0 | 6 | 5 | 4 | 3 | 2 | 1 | 0 | 9 | 8 | 7 | 6 | 7 | 8 | 9 | 0 | 1 | 2 | 3 | 4 | 5 |
| mem1 | 16 | 15 | 14 | 13 | 12 | 11 | 10 | 19 | 18 | 17 | 16 | 17 | 18 | 19 | 10 | 11 | 12 | 13 | 14 | 15 |
| mem2 | 26 | 25 | 24 | 23 | 22 | 21 | 20 | 29 | 28 | 27 | 26 | 27 | 28 | 29 | 20 | 21 | 22 | 23 | 24 | 25 |
| mem3 | 36 | 35 | 34 | 33 | 32 | 31 | 30 | 39 | 38 | 37 | 36 | 37 | 38 | 39 | 30 | 31 | 32 | 33 | 34 | 35 |
| mem4 | 46 | 45 | 44 | 43 | 42 | 41 | 40 | 49 | 48 | 47 | 46 | 47 | 48 | 49 | 40 | 41 | 42 | 43 | 44 | 45 |
| mem5 | 56 | 55 | 54 | 53 | 52 | 51 | 50 | 59 | 58 | 57 | 56 | 57 | 58 | 59 | 50 | 51 | 52 | 53 | 54 | 55 |
| mem6 | 66 | 65 | 64 | 63 | 62 | 61 | 60 | 69 | 68 | 67 | 66 | 67 | 68 | 68 | 60 | 61 | 62 | 63 | 64 | 65 |
| mem7 | 76 | 75 | 74 | 73 | 72 | 71 | 70 | 79 | 78 | 77 | 76 | 77 | 78 | 79 | 70 | 71 | 72 | 73 | 74 | 75 |
| mem8 | 86 | 85 | 84 | 83 | 82 | 81 | 80 | 89 | 88 | 87 | 86 | 87 | 88 | 89 | 80 | 81 | 82 | 83 | 84 | 85 |
| mem9 | 96 | 95 | 94 | 93 | 92 | 91 | 90 | 99 | 98 | 97 | 96 | 97 | 98 | 99 | 90 | 91 | 92 | 93 | 94 | 95 |

| order | Even_Rd_Addr | Odd_Rd_Addr | bit_order |
|---|---|---|---|
| 0 | 2 | 4 | 3 |
| 1 | 2 | 4 | 0 |
| 2 | 4 | 1 | 3 |
| 3 | 4 | 1 | 0 |
| 4 | 1 | 3 | 3 |
| 5 | 1 | 3 | 0 |
| 6 | 3 | 0 | 3 |
| 7 | 3 | 0 | 0 |
| 8 | 0 | 2 | 3 |
| 9 | 0 | 2 | 0 |
| 10 | 0 | 2 | 0 |
| 11 | 0 | 2 | 3 |
| 12 | 3 | 0 | 0 |
| 13 | 3 | 0 | 3 |
| 14 | 1 | 3 | 0 |
| 15 | 1 | 3 | 3 |
| 16 | 4 | 1 | 0 |
| 17 | 4 | 1 | 3 |
| 18 | 2 | 4 | 0 |
| 19 | 2 | 4 | 3 |

FIG. 11

| order | Even_Rd_Addr | Odd_Rd_Addr | bit_order |
|---|---|---|---|
| 0 | 3 | 0 | 4 |
| 1 | 3 | 0 | 1 |
| 2 | 0 | 2 | 4 |
| 3 | 0 | 2 | 1 |
| 4 | 2 | 4 | 4 |
| 5 | 2 | 4 | 1 |
| 6 | 4 | 1 | 4 |
| 7 | 4 | 1 | 1 |
| 8 | 1 | 3 | 4 |
| 9 | 1 | 3 | 1 |
| 10 | 3 | 0 | 4 |
| 11 | 1 | 3 | 1 |
| 12 | 1 | 3 | 4 |
| 13 | 4 | 1 | 1 |
| 14 | 4 | 1 | 4 |
| 15 | 2 | 4 | 1 |
| 16 | 2 | 4 | 4 |
| 17 | 0 | 2 | 1 |
| 18 | 0 | 2 | 4 |
| 19 | 3 | 0 | 1 |

FIG. 13

| order | Even_Rd_Addr | Odd_Rd_Addr | bit_order |
|---|---|---|---|
| 0 | 4 | 1 | 2 |
| 1 | 1 | 3 | 5 |
| 2 | 1 | 3 | 2 |
| 3 | 3 | 0 | 5 |
| 4 | 3 | 0 | 2 |
| 5 | 0 | 2 | 5 |
| 6 | 0 | 2 | 2 |
| 7 | 2 | 4 | 5 |
| 8 | 2 | 4 | 2 |
| 9 | 4 | 1 | 5 |
| 10 | 4 | 1 | 2 |
| 11 | 4 | 1 | 5 |
| 12 | 2 | 4 | 2 |
| 13 | 2 | 4 | 5 |
| 14 | 0 | 2 | 2 |
| 15 | 0 | 2 | 5 |
| 16 | 3 | 0 | 2 |
| 17 | 3 | 0 | 5 |
| 18 | 1 | 3 | 2 |
| 19 | 1 | 3 | 5 |

FIG. 15

| | bit_order | i=0 | | | | | | i=1 | | | | | |
|---|---|---|---|---|---|---|---|---|---|---|---|---|---|
| | addr | 0 | 1 | 2 | 3 | 4 | 5 | 0 | 1 | 2 | 3 | 4 | 5 |
| j=0 | 0 | 0 | 1 | 2 | 3 | 4 | 5 | 6 | 7 | 8 | 9 | 10 | 11 |
| | 1 | 12 | 13 | 14 | 15 | 16 | 17 | 18 | 19 | 20 | 21 | 22 | 23 |
| | 2 | 24 | 25 | 26 | 27 | 28 | 29 | 30 | 31 | 32 | 33 | 34 | 35 |
| | 3 | 36 | 37 | 38 | 39 | 40 | 41 | 42 | 43 | 44 | 45 | 46 | 47 |
| | 4 | 48 | 49 | 50 | 51 | 52 | 53 | 54 | 55 | 56 | 57 | 58 | 59 |
| | 5 | 300 | 301 | 302 | 303 | 304 | 305 | 306 | 307 | 308 | 309 | 310 | 311 |
| | 6 | 312 | 313 | 314 | 315 | 316 | 317 | 318 | 319 | 320 | 321 | 322 | 323 |
| | 7 | 324 | 325 | 326 | 327 | 328 | 329 | 330 | 331 | 332 | 333 | 334 | 335 |
| | 8 | 336 | 337 | 338 | 339 | 340 | 341 | 342 | 343 | 344 | 345 | 346 | 347 |
| | 9 | 348 | 349 | 350 | 351 | 352 | 353 | 354 | 355 | 356 | 357 | 358 | 359 |
| j=1 | 0 | 60 | 61 | 62 | 63 | 64 | 65 | 66 | 67 | 68 | 69 | 70 | 71 |
| | 1 | 72 | 73 | 74 | 75 | 76 | 77 | 78 | 79 | 80 | 81 | 82 | 83 |
| | 2 | 84 | 85 | 86 | 87 | 88 | 89 | 90 | 91 | 92 | 93 | 94 | 95 |
| | 3 | 96 | 97 | 98 | 99 | 100 | 101 | 102 | 103 | 104 | 105 | 106 | 107 |
| | 4 | 108 | 109 | 110 | 111 | 112 | 113 | 114 | 115 | 116 | 117 | 118 | 119 |
| | 5 | 360 | 361 | 362 | 363 | 364 | 365 | 366 | 367 | 368 | 369 | 370 | 371 |
| | 6 | 372 | 373 | 374 | 375 | 376 | 377 | 378 | 379 | 380 | 381 | 382 | 383 |
| | 7 | 384 | 385 | 386 | 387 | 388 | 389 | 390 | 391 | 392 | 393 | 394 | 395 |
| | 8 | 396 | 397 | 398 | 399 | 400 | 401 | 402 | 403 | 404 | 405 | 406 | 407 |
| | 9 | 408 | 409 | 400 | 411 | 412 | 413 | 414 | 415 | 416 | 417 | 418 | 419 |
| j=2 | 0 | 120 | 121 | 122 | 123 | 124 | 125 | 126 | 127 | 128 | 129 | 130 | 131 |
| | 1 | 132 | 133 | 134 | 135 | 136 | 137 | 138 | 139 | 140 | 141 | 142 | 143 |
| | 2 | 144 | 145 | 146 | 147 | 148 | 149 | 150 | 151 | 152 | 153 | 154 | 155 |
| | 3 | 156 | 157 | 158 | 159 | 160 | 161 | 162 | 163 | 164 | 165 | 166 | 167 |
| | 4 | 168 | 169 | 170 | 171 | 172 | 173 | 174 | 175 | 176 | 177 | 178 | 179 |
| | 5 | 420 | 421 | 422 | 423 | 424 | 425 | 426 | 427 | 428 | 429 | 430 | 431 |
| | 6 | 132 | 433 | 434 | 435 | 436 | 437 | 438 | 439 | 440 | 441 | 442 | 443 |
| | 7 | 144 | 445 | 446 | 447 | 448 | 449 | 450 | 451 | 452 | 453 | 454 | 455 |
| | 8 | 156 | 457 | 458 | 459 | 460 | 461 | 462 | 463 | 464 | 465 | 466 | 467 |
| | 9 | 168 | 469 | 470 | 471 | 472 | 473 | 474 | 475 | 476 | 477 | 478 | 479 |
| j=3 | 0 | 180 | 181 | 182 | 183 | 184 | 185 | 186 | 187 | 188 | 189 | 190 | 191 |
| | 1 | 192 | 193 | 194 | 195 | 196 | 197 | 198 | 199 | 200 | 201 | 202 | 203 |
| | 2 | 204 | 205 | 206 | 207 | 208 | 209 | 210 | 211 | 212 | 213 | 214 | 215 |
| | 3 | 216 | 217 | 218 | 219 | 220 | 221 | 222 | 223 | 224 | 225 | 226 | 227 |
| | 4 | 228 | 229 | 230 | 231 | 232 | 233 | 234 | 235 | 236 | 237 | 238 | 239 |
| | 5 | 480 | 481 | 482 | 483 | 484 | 485 | 486 | 487 | 488 | 489 | 490 | 491 |
| | 6 | 492 | 493 | 494 | 495 | 496 | 497 | 498 | 499 | 500 | 501 | 502 | 503 |
| | 7 | 504 | 505 | 506 | 507 | 508 | 509 | 510 | 511 | 512 | 513 | 514 | 515 |
| | 8 | 516 | 517 | 518 | 519 | 520 | 521 | 522 | 523 | 524 | 525 | 526 | 527 |
| | 9 | 528 | 529 | 530 | 531 | 532 | 533 | 534 | 535 | 536 | 537 | 538 | 539 |
| j=4 | 0 | 240 | 241 | 242 | 243 | 244 | 245 | 246 | 247 | 248 | 249 | 250 | 251 |
| | 1 | 252 | 253 | 254 | 255 | 256 | 257 | 258 | 259 | 260 | 261 | 262 | 263 |
| | 2 | 264 | 265 | 266 | 267 | 268 | 269 | 270 | 271 | 272 | 273 | 274 | 275 |
| | 3 | 276 | 277 | 278 | 279 | 280 | 281 | 282 | 283 | 284 | 285 | 286 | 287 |
| | 4 | 288 | 289 | 290 | 291 | 292 | 293 | 294 | 295 | 296 | 297 | 298 | 299 |
| | 5 | 540 | 541 | 542 | 543 | 544 | 545 | 546 | 547 | 548 | 549 | 550 | 551 |
| | 6 | 552 | 553 | 554 | 555 | 556 | 557 | 558 | 559 | 560 | 561 | 562 | 563 |
| | 7 | 564 | 565 | 566 | 567 | 568 | 569 | 570 | 571 | 572 | 573 | 574 | 575 |
| | 8 | 576 | 577 | 578 | 579 | 580 | 581 | 582 | 583 | 584 | 585 | 586 | 587 |
| | 9 | 588 | 589 | 590 | 591 | 592 | 593 | 594 | 595 | 596 | 597 | 598 | 599 |

FIG. 16

| 0 | 3 | 6 | 9 | 12 | 15 | 18' | 21 | 24 | 27 |
|---|---|---|---|---|---|---|---|---|---|
| 30 | 33 | 36 | 39 | 42 | 45 | 48 | 51 | 54 | 57 |
| 60 | 63 | 66 | 69 | 72 | 75 | 78 | 81 | 84 | 87 |
| 90 | 93 | 96 | 99 | 102 | 105 | 108 | 111 | 114 | 117 |
| 120 | 123 | 126 | 129 | 132 | 135 | 138 | 141 | 144 | 147 |
| 150 | 153 | 156 | 159 | 162 | 165 | 168 | 171 | 174 | 177 |
| 180 | 183 | 186 | 189 | 192 | 195 | 198 | 201 | 204 | 207 |
| 210 | 213 | 216 | 219 | 222 | 225 | 228 | 231 | 234 | 237 |
| 240 | 243 | 246 | 249 | 252 | 255 | 258 | 261 | 264 | 267 |
| 270 | 273 | 276 | 279 | 282 | 285 | 288 | 291 | 294 | 297 |
| 300 | 303 | 306 | 309 | 312 | 315 | 318 | 321 | 324 | 327 |
| 330 | 333 | 336 | 339 | 342 | 345 | 348 | 351 | 354 | 357 |
| 360 | 363 | 366 | 369 | 372 | 375 | 378 | 381 | 384 | 387 |
| 390 | 393 | 396 | 399 | 402 | 405 | 408 | 411 | 414 | 417 |
| 420 | 423 | 426 | 429 | 432 | 435 | 438 | 441 | 444 | 447 |
| 450 | 453 | 456 | 459 | 462 | 465 | 468 | 471 | 474 | 477 |
| 480 | 483 | 486 | 489 | 492 | 495 | 498 | 501 | 504 | 507 |
| 510 | 513 | 516 | 519 | 522 | 525 | 528 | 531 | 534 | 537 |
| 540 | 543 | 546 | 549 | 552 | 555 | 558 | 561 | 564 | 567 |
| 570 | 573 | 576 | 579 | 582 | 585 | 588 | 591 | 594 | 597 |

} 1610

| 1 | 4 | 7 | 10 | 13 | 16 | 19 | 22 | 25 | 28 |
|---|---|---|---|---|---|---|---|---|---|
| 31 | 34 | 37 | 40 | 43 | 46 | 49 | 52 | 55 | 58 |
| 61 | 64 | 67 | 70 | 73 | 76 | 79 | 82 | 85 | 88 |
| 91 | 94 | 97 | 100 | 103 | 106 | 109 | 112 | 115 | 118 |
| 121 | 124 | 127 | 130 | 133 | 136 | 139 | 142 | 145 | 148 |
| 151 | 154 | 157 | 160 | 163 | 166 | 169 | 172 | 175 | 178 |
| 181 | 184 | 187 | 190 | 193 | 196 | 199 | 202 | 205 | 208 |
| 211 | 214 | 217 | 220 | 223 | 226 | 229 | 232 | 235 | 238 |
| 241 | 244 | 247 | 250 | 253 | 256 | 259 | 262 | 265 | 268 |
| 271 | 274 | 277 | 280 | 283 | 286 | 289 | 292 | 295 | 298 |
| 301 | 304 | 307 | 310 | 313 | 316 | 319 | 322 | 325 | 328 |
| 331 | 334 | 337 | 340 | 343 | 346 | 349 | 352 | 355 | 358 |
| 361 | 364 | 367 | 370 | 373 | 376 | 379 | 382 | 385 | 388 |
| 391 | 394 | 397 | 400 | 403 | 406 | 409 | 412 | 415 | 418 |
| 421 | 424 | 427 | 430 | 433 | 436 | 439 | 442 | 445 | 448 |
| 451 | 454 | 457 | 460 | 463 | 466 | 469 | 472 | 475 | 478 |
| 481 | 484 | 487 | 490 | 493 | 496 | 499 | 502 | 505 | 508 |
| 511 | 514 | 517 | 520 | 523 | 526 | 529 | 532 | 535 | 538 |
| 541 | 544 | 547 | 550 | 553 | 556 | 559 | 562 | 565 | 568 |
| 571 | 574 | 577 | 580 | 583 | 586 | 589 | 592 | 595 | 598 |

} 1620

| 2 | 5 | 8 | 11 | 14 | 17 | 20 | 23 | 26 | 29 |
|---|---|---|---|---|---|---|---|---|---|
| 32 | 35 | 38 | 41 | 44 | 47 | 50 | 53 | 56 | 59 |
| 62 | 65 | 68 | 71 | 74 | 77 | 80 | 83 | 86 | 89 |
| 92 | 95 | 98 | 101 | 104 | 107 | 110 | 113 | 116 | 119 |
| 122 | 125 | 128 | 131 | 134 | 137 | 140 | 143 | 146 | 149 |
| 152 | 155 | 158 | 161 | 164 | 167 | 170 | 173 | 176 | 179 |
| 182 | 185 | 188 | 191 | 194 | 197 | 200 | 203 | 206 | 209 |
| 212 | 215 | 218 | 221 | 224 | 227 | 230 | 233 | 236 | 239 |
| 242 | 245 | 248 | 251 | 254 | 257 | 260 | 263 | 266 | 269 |
| 272 | 275 | 278 | 281 | 284 | 287 | 290 | 293 | 296 | 299 |
| 302 | 305 | 308 | 311 | 314 | 317 | 320 | 323 | 326 | 329 |
| 332 | 335 | 338 | 341 | 344 | 347 | 350 | 353 | 356 | 359 |
| 362 | 365 | 368 | 371 | 374 | 377 | 380 | 383 | 386 | 389 |
| 392 | 395 | 398 | 401 | 404 | 407 | 410 | 413 | 416 | 419 |
| 422 | 425 | 428 | 431 | 434 | 437 | 440 | 443 | 446 | 449 |
| 452 | 455 | 458 | 461 | 464 | 467 | 470 | 473 | 476 | 479 |
| 482 | 485 | 488 | 491 | 494 | 497 | 500 | 503 | 506 | 509 |
| 512 | 515 | 518 | 521 | 524 | 527 | 530 | 533 | 536 | 539 |
| 542 | 545 | 548 | 551 | 554 | 557 | 560 | 563 | 566 | 569 |
| 572 | 575 | 578 | 581 | 584 | 587 | 590 | 593 | 596 | 599 |

| 0 | 1 | 2 | 3 | 4 | 5 | 6 | 7 | 8 | 9 |
|---|---|---|---|---|---|---|---|---|---|
| 10 | 11 | 12 | 13 | 14 | 15 | 16 | 17 | 18 | 19 |
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |
| 90 | 91 | 92 | 93 | 94 | 95 | 96 | 97 | 98 | 99 |
| 100 | 101 | 102 | 103 | 104 | 105 | 106 | 107 | 108 | 109 |
| 110 | 111 | 112 | 113 | 114 | 115 | 116 | 117 | 118 | 119 |
| 120 | 121 | 122 | 123 | 124 | 125 | 126 | 127 | 128 | 129 |
| 130 | 131 | 132 | 133 | 134 | 135 | 136 | 137 | 138 | 139 |
| 140 | 141 | 142 | 143 | 144 | 145 | 146 | 147 | 148 | 149 |
| 150 | 151 | 152 | 153 | 154 | 155 | 156 | 157 | 158 | 159 |
| 160 | 161 | 162 | 163 | 164 | 165 | 166 | 167 | 168 | 169 |
| 170 | 171 | 172 | 173 | 174 | 175 | 176 | 177 | 178 | 179 |
| 180 | 181 | 182 | 183 | 184 | 185 | 186 | 187 | 188 | 189 |
| 190 | 191 | 192 | 193 | 194 | 195 | 196 | 197 | 198 | 199 |

⎫ 1710

| 0 | 1 | 2 | 3 | 4 | 5 | 6 | 7 | 8 | 9 |
|---|---|---|---|---|---|---|---|---|---|
| 10 | 11 | 12 | 13 | 14 | 15 | 16 | 17 | 18 | 19 |
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |
| 90 | 91 | 92 | 93 | 94 | 95 | 96 | 97 | 98 | 99 |
| 100 | 101 | 102 | 103 | 104 | 105 | 106 | 107 | 108 | 109 |
| 110 | 111 | 112 | 113 | 114 | 115 | 116 | 117 | 118 | 119 |
| 120 | 121 | 122 | 123 | 124 | 125 | 126 | 127 | 128 | 129 |
| 130 | 131 | 132 | 133 | 134 | 135 | 136 | 137 | 138 | 139 |
| 140 | 141 | 142 | 143 | 144 | 145 | 146 | 147 | 148 | 149 |
| 150 | 151 | 152 | 153 | 154 | 155 | 156 | 157 | 158 | 159 |
| 160 | 161 | 162 | 163 | 164 | 165 | 166 | 167 | 168 | 169 |
| 170 | 171 | 172 | 173 | 174 | 175 | 176 | 177 | 178 | 179 |
| 180 | 181 | 182 | 183 | 184 | 185 | 186 | 187 | 188 | 189 |
| 190 | 191 | 192 | 193 | 194 | 195 | 196 | 197 | 198 | 199 |

⎫ 1720

| 0 | 1 | 2 | 3 | 4 | 5 | 6 | 7 | 8 | 9 |
|---|---|---|---|---|---|---|---|---|---|
| 10 | 11 | 12 | 13 | 14 | 15 | 16 | 17 | 18 | 19 |
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |
| 90 | 91 | 92 | 93 | 94 | 95 | 96 | 97 | 98 | 99 |
| 100 | 101 | 102 | 103 | 104 | 105 | 106 | 107 | 108 | 109 |
| 110 | 111 | 112 | 113 | 114 | 115 | 116 | 117 | 118 | 119 |
| 120 | 121 | 122 | 123 | 124 | 125 | 126 | 127 | 128 | 129 |
| 130 | 131 | 132 | 133 | 134 | 135 | 136 | 137 | 138 | 139 |
| 140 | 141 | 142 | 143 | 144 | 145 | 146 | 147 | 148 | 149 |
| 150 | 151 | 152 | 153 | 154 | 155 | 156 | 157 | 158 | 159 |
| 160 | 161 | 162 | 163 | 164 | 165 | 166 | 167 | 168 | 169 |
| 170 | 171 | 172 | 173 | 174 | 175 | 176 | 177 | 178 | 179 |
| 180 | 181 | 182 | 183 | 184 | 185 | 186 | 187 | 188 | 189 |
| 190 | 191 | 192 | 193 | 194 | 195 | 196 | 197 | 198 | 199 |

| 0 | 10 | 20 | 30 | 40 | 50 | 60 | 70 | 80 | 90 |
|---|----|----|----|----|----|----|----|----|----|
| 100 | 110 | 120 | 130 | 140 | 150 | 160 | 170 | 180 | 190 |
| 1 | 11 | 21 | 31 | 41 | 51 | 61 | 71 | 81 | 91 |
| 101 | 111 | 121 | 131 | 141 | 151 | 161 | 171 | 181 | 191 |
| 2 | 12 | 22 | 32 | 42 | 52 | 62 | 72 | 82 | 92 |
| 102 | 112 | 122 | 132 | 142 | 152 | 162 | 172 | 182 | 192 |
| 3 | 13 | 23 | 33 | 43 | 53 | 63 | 73 | 83 | 93 |
| 103 | 113 | 123 | 133 | 143 | 153 | 163 | 173 | 183 | 193 |
| 4 | 14 | 24 | 34 | 44 | 54 | 64 | 74 | 84 | 94 |
| 104 | 114 | 124 | 134 | 144 | 154 | 164 | 174 | 184 | 194 |
| 5 | 15 | 25 | 35 | 45 | 55 | 65 | 75 | 85 | 95 |
| 105 | 115 | 125 | 135 | 145 | 155 | 165 | 175 | 185 | 195 |
| 6 | 16 | 26 | 36 | 46 | 56 | 66 | 76 | 86 | 96 |
| 106 | 116 | 126 | 136 | 146 | 156 | 166 | 176 | 186 | 196 |
| 7 | 17 | 27 | 37 | 47 | 57 | 67 | 77 | 87 | 97 |
| 107 | 117 | 127 | 137 | 147 | 157 | 167 | 177 | 187 | 197 |
| 8 | 18 | 28 | 38 | 48 | 58 | 68 | 78 | 88 | 98 |
| 108 | 118 | 128 | 138 | 148 | 158 | 168 | 178 | 188 | 198 |
| 9 | 19 | 29 | 39 | 49 | 59 | 69 | 79 | 89 | 99 |
| 109 | 119 | 129 | 139 | 149 | 159 | 169 | 179 | 189 | 199 |

1820:

| 0 | 10 | 20 | 30 | 40 | 50 | 60 | 70 | 80 | 90 |
|---|----|----|----|----|----|----|----|----|----|
| 100 | 110 | 120 | 130 | 140 | 150 | 160 | 170 | 180 | 190 |
| 1 | 11 | 21 | 31 | 41 | 51 | 61 | 71 | 81 | 91 |
| 101 | 111 | 121 | 131 | 141 | 151 | 161 | 171 | 181 | 191 |
| 2 | 12 | 22 | 32 | 42 | 52 | 62 | 72 | 82 | 92 |
| 102 | 112 | 122 | 132 | 142 | 152 | 162 | 172 | 182 | 192 |
| 3 | 13 | 23 | 33 | 43 | 53 | 63 | 73 | 83 | 93 |
| 103 | 113 | 123 | 133 | 143 | 153 | 163 | 173 | 183 | 193 |
| 4 | 14 | 24 | 34 | 44 | 54 | 64 | 74 | 84 | 94 |
| 104 | 114 | 124 | 134 | 144 | 154 | 164 | 174 | 184 | 194 |
| 5 | 15 | 25 | 35 | 45 | 55 | 65 | 75 | 85 | 95 |
| 105 | 115 | 125 | 135 | 145 | 155 | 165 | 175 | 185 | 195 |
| 6 | 16 | 26 | 36 | 46 | 56 | 66 | 76 | 86 | 96 |
| 106 | 116 | 126 | 136 | 146 | 156 | 166 | 176 | 186 | 196 |
| 7 | 17 | 27 | 37 | 47 | 57 | 67 | 77 | 87 | 97 |
| 107 | 117 | 127 | 137 | 147 | 157 | 167 | 177 | 187 | 197 |
| 8 | 18 | 28 | 38 | 48 | 58 | 68 | 78 | 88 | 98 |
| 108 | 118 | 128 | 138 | 148 | 158 | 168 | 178 | 188 | 198 |
| 9 | 19 | 29 | 39 | 49 | 59 | 69 | 79 | 89 | 99 |
| 109 | 119 | 129 | 139 | 149 | 159 | 169 | 179 | 189 | 199 |

1830:

| 0 | 10 | 20 | 30 | 40 | 50 | 60 | 70 | 80 | 90 |
|---|----|----|----|----|----|----|----|----|----|
| 100 | 110 | 120 | 130 | 140 | 150 | 160 | 170 | 180 | 190 |
| 1 | 11 | 21 | 31 | 41 | 51 | 61 | 71 | 81 | 91 |
| 101 | 111 | 121 | 131 | 141 | 151 | 161 | 171 | 181 | 191 |
| 2 | 12 | 22 | 32 | 42 | 52 | 62 | 72 | 82 | 92 |
| 102 | 112 | 122 | 132 | 142 | 152 | 162 | 172 | 182 | 192 |
| 3 | 13 | 23 | 33 | 43 | 53 | 63 | 73 | 83 | 93 |
| 103 | 113 | 123 | 133 | 143 | 153 | 163 | 173 | 183 | 193 |
| 4 | 14 | 24 | 34 | 44 | 54 | 64 | 74 | 84 | 94 |
| 104 | 114 | 124 | 134 | 144 | 154 | 164 | 174 | 184 | 194 |
| 5 | 15 | 25 | 35 | 45 | 55 | 65 | 75 | 85 | 95 |
| 105 | 115 | 125 | 135 | 145 | 155 | 165 | 175 | 185 | 195 |
| 6 | 16 | 26 | 36 | 46 | 56 | 66 | 76 | 86 | 96 |
| 106 | 116 | 126 | 136 | 146 | 156 | 166 | 176 | 186 | 196 |
| 7 | 17 | 27 | 37 | 47 | 57 | 67 | 77 | 87 | 97 |
| 107 | 117 | 127 | 137 | 147 | 157 | 167 | 177 | 187 | 197 |
| 8 | 18 | 28 | 38 | 48 | 58 | 68 | 78 | 88 | 98 |
| 108 | 118 | 128 | 138 | 148 | 158 | 168 | 178 | 188 | 198 |
| 9 | 19 | 29 | 39 | 49 | 59 | 69 | 79 | 89 | 99 |
| 109 | 119 | 129 | 139 | 149 | 159 | 169 | 179 | 189 | 199 |

FIG. 19

Table 1910:

| 0 | 10 | 20 | 30 | 40 | 50 | 60 | 70 | 80 | 90 |
|---|----|----|----|----|----|----|----|----|----|
| 100 | 110 | 120 | 130 | 140 | 150 | 160 | 170 | 180 | 190 |
| 1 | 11 | 21 | 31 | 41 | 51 | 61 | 71 | 81 | 91 |
| 101 | 111 | 121 | 131 | 141 | 151 | 161 | 171 | 181 | 191 |
| 2 | 12 | 22 | 32 | 42 | 52 | 62 | 72 | 82 | 92 |
| 102 | 112 | 122 | 132 | 142 | 152 | 162 | 172 | 182 | 192 |
| 3 | 13 | 23 | 33 | 43 | 53 | 63 | 73 | 83 | 93 |
| 103 | 113 | 123 | 133 | 143 | 153 | 163 | 173 | 183 | 193 |
| 4 | 14 | 24 | 34 | 44 | 54 | 64 | 74 | 84 | 94 |
| 104 | 114 | 124 | 134 | 144 | 154 | 164 | 174 | 184 | 194 |
| 5 | 15 | 25 | 35 | 45 | 55 | 65 | 75 | 85 | 95 |
| 105 | 115 | 125 | 135 | 145 | 155 | 165 | 175 | 185 | 195 |
| 6 | 16 | 26 | 36 | 46 | 56 | 66 | 76 | 86 | 96 |
| 106 | 116 | 126 | 136 | 146 | 156 | 166 | 176 | 186 | 196 |
| 7 | 17 | 27 | 37 | 47 | 57 | 67 | 77 | 87 | 97 |
| 107 | 117 | 127 | 137 | 147 | 157 | 167 | 177 | 187 | 197 |
| 8 | 18 | 28 | 38 | 48 | 58 | 68 | 78 | 88 | 98 |
| 108 | 118 | 128 | 138 | 148 | 158 | 168 | 178 | 188 | 198 |
| 9 | 19 | 29 | 39 | 49 | 59 | 69 | 79 | 89 | 99 |
| 109 | 119 | 129 | 139 | 149 | 159 | 169 | 179 | 189 | 199 |

Table 1920:

| 63 | 73 | 83 | 93 | 103 | 113 | 123 | 133 | 143 | 153 |
|----|----|----|----|-----|-----|-----|-----|-----|-----|
| 163 | 173 | 183 | 193 | 4 | 14 | 24 | 34 | 44 | 54 |
| 64 | 74 | 84 | 94 | 104 | 114 | 124 | 134 | 144 | 154 |
| 164 | 174 | 184 | 194 | 5 | 15 | 25 | 35 | 45 | 55 |
| 65 | 75 | 85 | 95 | 105 | 115 | 125 | 135 | 145 | 155 |
| 165 | 175 | 185 | 195 | 6 | 116 | 26 | 36 | 46 | 56 |
| 66 | 76 | 86 | 96 | 106 | 116 | 126 | 136 | 146 | 156 |
| 166 | 176 | 186 | 196 | 7 | 17 | 27 | 37 | 47 | 57 |
| 67 | 77 | 87 | 97 | 107 | 117 | 127 | 137 | 147 | 157 |
| 167 | 177 | 187 | 197 | 8 | 18 | 28 | 38 | 48 | 58 |
| 68 | 78 | 88 | 98 | 108 | 118 | 128 | 138 | 148 | 158 |
| 168 | 178 | 188 | 198 | 9 | 19 | 29 | 39 | 49 | 59 |
| 69 | 79 | 89 | 99 | 109 | 119 | 129 | 139 | 149 | 159 |
| 169 | 179 | 189 | 199 | 0 | 10 | 20 | 30 | 40 | 50 |
| 60 | 70 | 80 | 90 | 100 | 110 | 120 | 130 | 140 | 150 |
| 160 | 170 | 180 | 190 | 1 | 11 | 21 | 31 | 41 | 51 |
| 61 | 71 | 81 | 91 | 101 | 111 | 121 | 131 | 141 | 151 |
| 161 | 171 | 181 | 191 | 2 | 12 | 22 | 32 | 42 | 52 |
| 62 | 72 | 82 | 92 | 102 | 112 | 122 | 132 | 142 | 152 |
| 162 | 172 | 182 | 192 | 3 | 13 | 23 | 33 | 43 | 53 |

Table 1930:

| 126 | 136 | 146 | 156 | 166 | 176 | 186 | 196 | 7 | 17 |
|-----|-----|-----|-----|-----|-----|-----|-----|---|----|
| 27 | 37 | 47 | 57 | 67 | 77 | 87 | 97 | 107 | 117 |
| 127 | 137 | 147 | 157 | 167 | 177 | 187 | 197 | 8 | 18 |
| 28 | 38 | 48 | 58 | 68 | 78 | 88 | 98 | 108 | 118 |
| 128 | 138 | 148 | 158 | 168 | 178 | 188 | 198 | 9 | 19 |
| 29 | 39 | 49 | 59 | 69 | 79 | 89 | 99 | 109 | 119 |
| 129 | 139 | 149 | 159 | 169 | 179 | 189 | 199 | 0 | 10 |
| 20 | 30 | 40 | 50 | 60 | 70 | 80 | 90 | 100 | 110 |
| 120 | 130 | 140 | 150 | 160 | 170 | 180 | 190 | 1 | 11 |
| 21 | 31 | 41 | 51 | 61 | 71 | 81 | 91 | 101 | 111 |
| 121 | 131 | 141 | 151 | 161 | 171 | 181 | 191 | 2 | 12 |
| 22 | 32 | 42 | 52 | 62 | 72 | 82 | 92 | 102 | 112 |
| 122 | 132 | 142 | 152 | 162 | 172 | 182 | 192 | 3 | 13 |
| 23 | 33 | 43 | 53 | 63 | 73 | 83 | 93 | 103 | 113 |
| 123 | 133 | 143 | 153 | 163 | 173 | 183 | 193 | 4 | 14 |
| 24 | 34 | 44 | 54 | 64 | 74 | 84 | 94 | 104 | 114 |
| 124 | 134 | 144 | 154 | 164 | 174 | 184 | 194 | 5 | 15 |
| 25 | 35 | 45 | 55 | 65 | 75 | 85 | 95 | 105 | 115 |
| 125 | 135 | 145 | 155 | 165 | 175 | 185 | 195 | 6 | 16 |
| 26 | 36 | 46 | 56 | 66 | 76 | 86 | 96 | 106 | 116 |

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| out0 | 5 | 105 | 6 | 106 | 7 | 107 | 8 | 108 | 9 | 109 | 0 | 100 | 1 | 101 | 2 | 102 | 3 | 103 | 4 | 104 |
| out1 | 15 | 115 | 16 | 116 | 17 | 117 | 18 | 118 | 19 | 119 | 10 | 110 | 11 | 111 | 12 | 112 | 13 | 113 | 14 | 114 |
| out2 | 25 | 125 | 26 | 126 | 27 | 127 | 28 | 128 | 29 | 129 | 20 | 120 | 21 | 121 | 22 | 122 | 23 | 123 | 24 | 124 |
| out3 | 35 | 135 | 36 | 136 | 37 | 137 | 38 | 138 | 39 | 139 | 30 | 130 | 31 | 131 | 32 | 132 | 33 | 133 | 34 | 134 |
| out4 | 45 | 145 | 46 | 146 | 47 | 147 | 48 | 148 | 49 | 149 | 40 | 140 | 41 | 141 | 42 | 142 | 43 | 143 | 44 | 144 |
| out5 | 55 | 155 | 56 | 156 | 57 | 157 | 58 | 158 | 59 | 159 | 50 | 150 | 51 | 151 | 52 | 152 | 53 | 153 | 54 | 154 |
| out6 | 65 | 165 | 66 | 166 | 67 | 167 | 68 | 168 | 68 | 168 | 60 | 160 | 61 | 161 | 62 | 162 | 63 | 163 | 64 | 164 |
| out7 | 75 | 175 | 76 | 176 | 77 | 177 | 78 | 178 | 79 | 179 | 70 | 170 | 71 | 171 | 72 | 172 | 73 | 173 | 74 | 174 |
| out8 | 85 | 185 | 86 | 186 | 87 | 187 | 88 | 188 | 89 | 189 | 80 | 180 | 81 | 181 | 82 | 182 | 83 | 83 | 84 | 184 |
| out9 | 95 | 195 | 96 | 196 | 97 | 197 | 98 | 198 | 99 | 199 | 90 | 190 | 91 | 191 | 92 | 192 | 93 | 193 | 94 | 194 |

2020:

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| out0 | 68 | 168 | 68 | 168 | 60 | 160 | 61 | 161 | 62 | 162 | 63 | 163 | 64 | 164 | 65 | 165 | 66 | 166 | 67 | 167 |
| out1 | 78 | 178 | 79 | 179 | 70 | 170 | 71 | 171 | 72 | 172 | 73 | 173 | 74 | 174 | 75 | 175 | 76 | 176 | 77 | 177 |
| out2 | 88 | 188 | 89 | 189 | 80 | 180 | 81 | 181 | 82 | 182 | 83 | 83 | 84 | 184 | 85 | 185 | 86 | 186 | 87 | 187 |
| out3 | 98 | 198 | 99 | 199 | 90 | 190 | 91 | 191 | 92 | 192 | 93 | 193 | 94 | 194 | 95 | 195 | 96 | 196 | 97 | 197 |
| out4 | 108 | 9 | 109 | 0 | 100 | 1 | 101 | 2 | 102 | 3 | 103 | 4 | 104 | 5 | 105 | 6 | 106 | 7 | 107 | 8 |
| out5 | 118 | 19 | 119 | 10 | 110 | 11 | 111 | 12 | 112 | 13 | 113 | 14 | 114 | 15 | 115 | 16 | 116 | 17 | 117 | 18 |
| out6 | 128 | 29 | 129 | 20 | 120 | 21 | 121 | 22 | 122 | 23 | 123 | 24 | 124 | 25 | 125 | 26 | 126 | 27 | 127 | 28 |
| out7 | 138 | 39 | 139 | 30 | 130 | 31 | 131 | 32 | 132 | 33 | 133 | 34 | 134 | 35 | 135 | 36 | 136 | 37 | 137 | 38 |
| out8 | 148 | 49 | 149 | 40 | 140 | 41 | 141 | 42 | 142 | 43 | 143 | 44 | 144 | 45 | 145 | 46 | 146 | 47 | 147 | 48 |
| out9 | 158 | 59 | 159 | 50 | 150 | 51 | 151 | 52 | 152 | 53 | 153 | 54 | 154 | 55 | 155 | 56 | 156 | 57 | 157 | 58 |

2030:

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| out0 | 121 | 22 | 122 | 23 | 123 | 24 | 124 | 25 | 125 | 26 | 126 | 27 | 127 | 28 | 128 | 29 | 129 | 20 | 120 | 21 |
| out1 | 131 | 32 | 132 | 33 | 133 | 34 | 134 | 35 | 135 | 36 | 136 | 37 | 137 | 38 | 138 | 39 | 139 | 30 | 130 | 31 |
| out2 | 141 | 42 | 142 | 43 | 143 | 44 | 144 | 45 | 145 | 46 | 146 | 47 | 147 | 48 | 148 | 49 | 149 | 40 | 140 | 41 |
| out3 | 151 | 52 | 152 | 53 | 153 | 54 | 154 | 55 | 155 | 56 | 156 | 57 | 157 | 58 | 158 | 59 | 159 | 50 | 150 | 51 |
| out4 | 161 | 62 | 162 | 63 | 163 | 64 | 164 | 65 | 165 | 66 | 166 | 67 | 167 | 68 | 168 | 68 | 168 | 60 | 160 | 61 |
| out5 | 171 | 72 | 172 | 73 | 173 | 74 | 174 | 75 | 175 | 76 | 176 | 77 | 177 | 78 | 178 | 79 | 179 | 70 | 170 | 71 |
| out6 | 181 | 82 | 182 | 83 | 83 | 84 | 184 | 85 | 185 | 86 | 186 | 87 | 187 | 88 | 188 | 89 | 189 | 80 | 180 | 81 |
| out7 | 191 | 92 | 192 | 93 | 193 | 94 | 194 | 95 | 195 | 96 | 196 | 97 | 197 | 98 | 198 | 99 | 199 | 90 | 190 | 91 |
| out8 | 2 | 102 | 3 | 103 | 4 | 104 | 5 | 105 | 6 | 106 | 7 | 107 | 8 | 108 | 9 | 109 | 0 | 100 | 1 | 101 |
| out9 | 12 | 112 | 13 | 113 | 14 | 114 | 15 | 115 | 16 | 116 | 17 | 117 | 18 | 118 | 19 | 119 | 10 | 110 | 11 | 111 |

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| mem0 | 5 | 105 | 6 | 106 | 7 | 107 | 8 | 108 | 9 | 109 | 0 | 100 | 1 | 101 | 2 | 102 | 3 | 103 | 4 | 104 |
| mem1 | 15 | 115 | 16 | 116 | 17 | 117 | 18 | 118 | 19 | 119 | 10 | 110 | 11 | 111 | 12 | 112 | 13 | 113 | 14 | 114 |
| mem2 | 25 | 125 | 26 | 126 | 27 | 127 | 28 | 128 | 29 | 129 | 20 | 120 | 21 | 121 | 22 | 122 | 23 | 123 | 24 | 124 |
| mem3 | 35 | 135 | 36 | 136 | 37 | 137 | 38 | 138 | 39 | 139 | 30 | 130 | 31 | 131 | 32 | 132 | 33 | 133 | 34 | 134 |
| mem4 | 45 | 145 | 46 | 146 | 47 | 147 | 48 | 148 | 49 | 149 | 40 | 140 | 41 | 141 | 42 | 142 | 43 | 143 | 44 | 144 |
| mem5 | 55 | 155 | 56 | 156 | 57 | 157 | 58 | 158 | 59 | 159 | 50 | 150 | 51 | 151 | 52 | 152 | 53 | 153 | 54 | 154 |
| mem6 | 65 | 165 | 66 | 166 | 67 | 167 | 68 | 168 | 68 | 168 | 60 | 160 | 61 | 161 | 62 | 162 | 63 | 163 | 64 | 164 |
| mem7 | 75 | 175 | 76 | 176 | 77 | 177 | 78 | 178 | 79 | 179 | 70 | 170 | 71 | 171 | 72 | 172 | 73 | 173 | 74 | 174 |
| mem8 | 85 | 185 | 86 | 186 | 87 | 187 | 88 | 188 | 89 | 189 | 80 | 180 | 81 | 181 | 82 | 182 | 83 | 83 | 84 | 184 |
| mem9 | 95 | 195 | 96 | 196 | 97 | 197 | 98 | 198 | 99 | 199 | 90 | 190 | 91 | 191 | 92 | 192 | 93 | 193 | 94 | 194 |

2120:

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| mem0 | 8 | 108 | 9 | 109 | 0 | 100 | 1 | 101 | 2 | 102 | 3 | 103 | 4 | 104 | 5 | 105 | 6 | 106 | 7 | 107 |
| mem1 | 18 | 118 | 19 | 119 | 10 | 110 | 11 | 111 | 12 | 112 | 13 | 113 | 14 | 114 | 15 | 115 | 16 | 116 | 17 | 117 |
| mem2 | 28 | 128 | 29 | 129 | 20 | 120 | 21 | 121 | 22 | 122 | 23 | 123 | 24 | 124 | 25 | 125 | 26 | 126 | 27 | 127 |
| mem3 | 38 | 138 | 39 | 139 | 30 | 130 | 31 | 131 | 32 | 132 | 33 | 133 | 34 | 134 | 35 | 135 | 36 | 136 | 37 | 137 |
| mem4 | 48 | 148 | 49 | 149 | 40 | 140 | 41 | 141 | 42 | 142 | 43 | 143 | 44 | 144 | 45 | 145 | 46 | 146 | 47 | 147 |
| mem5 | 58 | 158 | 59 | 159 | 50 | 150 | 51 | 151 | 52 | 152 | 53 | 153 | 54 | 154 | 55 | 155 | 56 | 156 | 57 | 157 |
| mem6 | 68 | 168 | 68 | 168 | 60 | 160 | 61 | 161 | 62 | 162 | 63 | 163 | 64 | 164 | 65 | 165 | 66 | 166 | 67 | 167 |
| mem7 | 78 | 178 | 79 | 179 | 70 | 170 | 71 | 171 | 72 | 172 | 73 | 173 | 74 | 174 | 75 | 175 | 76 | 176 | 77 | 177 |
| mem8 | 88 | 188 | 89 | 189 | 80 | 180 | 81 | 181 | 82 | 182 | 83 | 83 | 84 | 184 | 85 | 185 | 86 | 186 | 87 | 187 |
| mem9 | 98 | 198 | 99 | 199 | 90 | 190 | 91 | 191 | 92 | 192 | 93 | 193 | 94 | 194 | 95 | 195 | 96 | 196 | 97 | 197 |

~2121

2130:

| order | 0 | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|---|
| mem0 | 101 | 2 | 102 | 3 | 103 | 4 | 104 | 5 | 105 | 6 | 106 | 7 | 107 | 8 | 108 | 9 | 109 | 0 | 100 | 1 |
| mem1 | 111 | 12 | 112 | 13 | 113 | 14 | 114 | 15 | 115 | 16 | 116 | 17 | 117 | 18 | 118 | 19 | 119 | 10 | 110 | 11 |
| mem2 | 121 | 22 | 122 | 23 | 123 | 24 | 124 | 25 | 125 | 26 | 126 | 27 | 127 | 28 | 128 | 29 | 129 | 20 | 120 | 21 |
| mem3 | 131 | 32 | 132 | 33 | 133 | 34 | 134 | 35 | 135 | 36 | 136 | 37 | 137 | 38 | 138 | 39 | 139 | 30 | 130 | 31 |
| mem4 | 141 | 42 | 142 | 43 | 143 | 44 | 144 | 45 | 145 | 46 | 146 | 47 | 147 | 48 | 148 | 49 | 149 | 40 | 140 | 41 |
| mem5 | 151 | 52 | 152 | 53 | 153 | 54 | 154 | 55 | 155 | 56 | 156 | 57 | 157 | 58 | 158 | 59 | 159 | 50 | 150 | 51 |
| mem6 | 161 | 62 | 162 | 63 | 163 | 64 | 164 | 65 | 165 | 66 | 166 | 67 | 167 | 68 | 168 | 68 | 168 | 60 | 160 | 61 |
| mem7 | 171 | 72 | 172 | 73 | 173 | 74 | 174 | 75 | 175 | 76 | 176 | 77 | 177 | 78 | 178 | 79 | 179 | 70 | 170 | 71 |
| mem8 | 181 | 82 | 182 | 83 | 83 | 84 | 184 | 85 | 185 | 86 | 186 | 87 | 187 | 88 | 188 | 89 | 189 | 80 | 180 | 81 |
| mem9 | 191 | 92 | 192 | 93 | 193 | 94 | 194 | 95 | 195 | 96 | 196 | 97 | 197 | 98 | 198 | 99 | 199 | 90 | 190 | 91 |

| order | Even_Rd_Addr | Odd_Rd_Addr | bit_order |
|---|---|---|---|
| 0 | 1 | 3 | 3 |
| 1 | 6 | 8 | 3 |
| 2 | 4 | 1 | 0 |
| 3 | 9 | 6 | 0 |
| 4 | 4 | 1 | 3 |
| 5 | 9 | 6 | 3 |
| 6 | 2 | 4 | 0 |
| 7 | 7 | 9 | 0 |
| 8 | 2 | 4 | 3 |
| 9 | 7 | 9 | 3 |
| 10 | 0 | 2 | 0 |
| 11 | 5 | 7 | 0 |
| 12 | 0 | 2 | 3 |
| 13 | 5 | 7 | 3 |
| 14 | 3 | 0 | 0 |
| 15 | 8 | 5 | 0 |
| 16 | 3 | 0 | 3 |
| 17 | 8 | 5 | 3 |
| 18 | 1 | 3 | 0 |
| 19 | 6 | 8 | 0 |

FIG. 23

| order | Even_Rd_Addr | Odd_Rd_Addr | bit_order |
|---|---|---|---|
| 0 | 2 | 4 | 1 |
| 1 | 7 | 9 | 1 |
| 2 | 2 | 4 | 4 |
| 3 | 7 | 9 | 4 |
| 4 | 0 | 2 | 1 |
| 5 | 5 | 7 | 1 |
| 6 | 0 | 2 | 4 |
| 7 | 5 | 7 | 4 |
| 8 | 3 | 0 | 1 |
| 9 | 8 | 5 | 1 |
| 10 | 3 | 0 | 4 |
| 11 | 8 | 5 | 4 |
| 12 | 1 | 3 | 1 |
| 13 | 6 | 8 | 1 |
| 14 | 1 | 3 | 4 |
| 15 | 6 | 8 | 4 |
| 16 | 4 | 1 | 1 |
| 17 | 9 | 6 | 1 |
| 18 | 4 | 1 | 4 |
| 19 | 9 | 6 | 4 |

FIG. 25

| order | Even_Rd_Addr | Odd_Rd_Addr | bit_order |
|---|---|---|---|
| 0 | 5 | 7 | 5 |
| 1 | 3 | 0 | 2 |
| 2 | 8 | 5 | 2 |
| 3 | 3 | 0 | 5 |
| 4 | 8 | 5 | 5 |
| 5 | 1 | 3 | 2 |
| 6 | 6 | 8 | 2 |
| 7 | 1 | 3 | 5 |
| 8 | 6 | 8 | 5 |
| 9 | 4 | 1 | 2 |
| 10 | 9 | 6 | 2 |
| 11 | 4 | 1 | 5 |
| 12 | 9 | 6 | 5 |
| 13 | 2 | 4 | 2 |
| 14 | 7 | 9 | 2 |
| 15 | 2 | 4 | 5 |
| 16 | 7 | 9 | 5 |
| 17 | 0 | 2 | 2 |
| 18 | 5 | 7 | 2 |
| 19 | 0 | 2 | 5 |

BIT INTERLEAVER AND METHOD OF BIT INTERLEAVING USING THE SAME

CROSS-REFERENCE TO RELATED APPLICATION

This application claims priority from Korean Patent Application No. 10-2006-0072286, filed on Jul. 31, 2006, in the Korean Intellectual Property Office, the entire disclosure of which is incorporated herein by reference.

BACKGROUND OF THE INVENTION

1. Field of the Invention

Methods and apparatuses consistent with the present invention relates to bit interleaving, and more particularly, bit interleaving which can satisfy a WiMedia Ultra-Wideband physical layer specification (UWB PHY spec).

2. Description of Related Art

Bit interleaving is performed so that a communication system can be robust against a burst error. Specifically, bit interleaving can acquire a frequency diversity effect in a frequency hopping method, such as a multi-band orthogonal frequency division multiplexing (MB-OFDM) scheme. In the MB-OFDM scheme, latency may be reduced by limiting bit interleaving to less than three OFDM symbols.

Here, bit interleaving of the MB-OFDM scheme includes two operations. A first operation corresponds to a symbol interleaving operation. A second operation corresponds to a tone interleaving operation.

Tone interleaving enables a frequency diversity effect to be acquired between tones in a single sub-band by scattering data in a single OFDM symbol.

As an example, when a number of coded bits per OFDM symbol is 100, symbol interleaving with respect to a bit stream containing three symbols may be represented as, 0, 1, 2, 3, 4, 5, . . . , 299
→0, 3, 6, 9, . . . , 297, 1, 4, 7, 10, . . . , 298, 2, 5, 8, 11, . . . , 299

Also, tone interleaving with respect to a result of the symbol interleaving may be represented as, 0, 3, 6, 9, . . . , 297, 1, 4, 7, 10, . . . , 298, 2, 5, 8, 11, . . . , 299
→0, 30, 60, 90, . . . , 270, 3, 33, 63, 93, . . . , 273, 6, 36, 66, 96, . . . , 276, . . . .

U.S. Patent Publication No. 20040178934 discloses in detail a symbol interleaver and a tone interleaver for performing symbol interleaving and tone interleaving respectively.

When performing only symbol interleaving and tone interleaving, interleaving may be easily performed by simply arranging input data two-dimensionally in a storage space and appropriately reading the arranged input data. However, WiMedia UWB PHY spec 1.0 performs interleaving by adding an "intra-symbol cyclic shift" function.

Specifically, WiMedia UWB PHY spec 1.0 performs symbol interleaving and tone interleaving, and also performs a cyclic shift. Thus, when simply reading a memory as in a conventional art, interleaving may not be generally performed.

Accordingly, a new type of bit interleaver and bit interleaving method which can perform bit interleaving including a cyclic shift without adding complex hardware is required.

SUMMARY OF THE INVENTION

The present invention provides a bit interleaver and a bit interleaving method which can easily and effectively perform bit interleaving including a cyclic shift.

The present invention also provides a bit interleaver and a bit interleaving method which can satisfy requirements of at least WiMedia Ultra-Wideband UWB PHY spec 1.0.

The present invention also provides a bit interleaver and a bit interleaving method which can easily perform a cyclic shift operation by using an output feature of result of symbol interleaving and tone interleaving.

According to an aspect of the present invention, there is provided a bit interleaver including: delay devices which are applied with symbol interleaving and tone interleaving and delay a bit stream outputted from a memory, to generate a delayed bit stream; a first multiplexer (MUX) unit which selects any one of a bit of the bit stream outputted from the memory and a bit of the delayed bit stream, to generate a selection bit stream; and a second MUX unit which changes an order of the selection bit stream to generate an output bit stream.

The bit interleaver may further include a register which stores a portion of bits of a previous bit stream output from the memory, a predetermined clock before the bit stream is output from the memory; and a third MUX unit which selects any one of an output of the register and a portion of output bits of the second MUX unit to generate the output bit stream.

Also, the bit stream output from the memory may correspond to indexes having an identical number in a one's column.

Also, the first MUX unit may select a bit corresponding to the delayed bit stream with respect to bits not corresponding to bits stored in the register, when selecting a bit corresponding to the bit stream output from the memory with respect to bits corresponding to the bits stored in the register among the bit stream output from the memory.

Also, the third MUX unit may generate a predetermined number of higher bits of the output bit stream by using a predetermined number of lower bits of the previous bit stream.

According to another aspect of the present invention, there is provided a bit interleaver including: delay devices which are applied with symbol interleaving and tone interleaving, and delay a portion of bits of a bit stream output from a memory to generate a delayed bit stream; a register which stores a portions of bits of a previous bit stream output from the memory, a predetermined clock before the bit stream is output from the memory; and a MUX unit which selects any one of an output of the register and bits corresponding to a bit stream, the bit stream which is not delayed by the delay devices and output from the memory, wherein the bit interleaver generates an output bit stream by using the delay devices and the output of the MUX unit.

The bit interleaving method may further include storing a portion of bits of a previous bit stream output from the memory, a predetermined clock before the bit stream is output from the memory, and replacing a portion of bits of the output bit stream with the stored bits.

According to still another aspect of the present invention, there is provided a bit interleaving method including: outputting a bit stream corresponding to a result of symbol interleaving and tone interleaving, from a memory; generating a delayed bit stream by delaying a portion of bits of the bit stream output from the memory; and generating an output bit stream by storing a portion of bits of a previous bit stream output from the memory, a predetermined clock before the bit stream is output from the memory, and replacing a portion of bits of the output bit stream with the stored bits.

BRIEF DESCRIPTION OF THE DRAWINGS

The above and other aspects of the present invention will become apparent and more readily appreciated from the following detailed description of certain exemplary embodiments of the invention, taken in conjunction with the accompanying drawings of which:

FIG. 2 is a table illustrating an example of a 300 bit input stored in a memory when an interleaver operates at 53.3 Mbps;

FIG. 3 is a table illustrating a result of symbol interleaving performed with respect to the 300 bit input as shown in FIG. 2;

FIG. 4 is a table illustrating a result of indicating the result of symbol interleaving as shown in FIG. 3 as index 0 to index 99;

FIG. 5 is a table illustrating a result of tone interleaving performed with respect to the result as shown in FIG. 4;

FIG. 7 is a table illustrating an output bit stream of a bit interleaver according to an exemplary embodiment of the present invention;

FIG. 8 is a table illustrating a bit stream output from a memory to generate the output bit stream as shown in FIG. 7;

FIG. 9 is a table illustrating a memory control signal applied to output a first group as shown in FIG. 8 from a memory;

FIG. 11 is a table illustrating a memory control signal applied to output a second group as shown in FIG. 8 from a memory;

FIG. 13 is a table illustrating a memory control signal applied to output a third group as shown in FIG. 8 from a memory;

FIG. 15 is a table illustrating an example of a 600 bit input stored in a memory when an interleaver operates at 106.7 Mbps or 200 Mbps;

FIG. 16 is a table illustrating a result of symbol interleaving performed with respect to the 600 bit input as shown in FIG. 15;

FIG. 17 is a table illustrating a result of indicating the result of symbol interleaving as shown in FIG. 16 as index 0 to index 199;

FIG. 18 is a table illustrating a result of tone interleaving performed with respect to the result as shown in FIG. 17;

FIG. 19 is a table illustrating a result of a cyclic shift performed with respect to the result as shown in FIG. 18;

FIG. 20 is a table illustrating an output bit stream of a bit interleaver according to an exemplary embodiment of the present invention;

FIG. 21 is a table illustrating a bit stream output from a memory to generate the output bit stream as shown in FIG. 20;

FIG. 22 is a table illustrating a memory control signal applied to generate a first group as shown in FIG. 21 from a memory;

FIG. 23 is a table illustrating a memory control signal applied to output a second group as shown in FIG. 21 from a memory;

FIG. 25 is a diagram illustrating a memory control signal applied to output a third group as shown in FIG. 21 from a memory;

DETAILED DESCRIPTION OF EXEMPLARY EMBODIMENTS OF THE INVENTION

Figure 1:
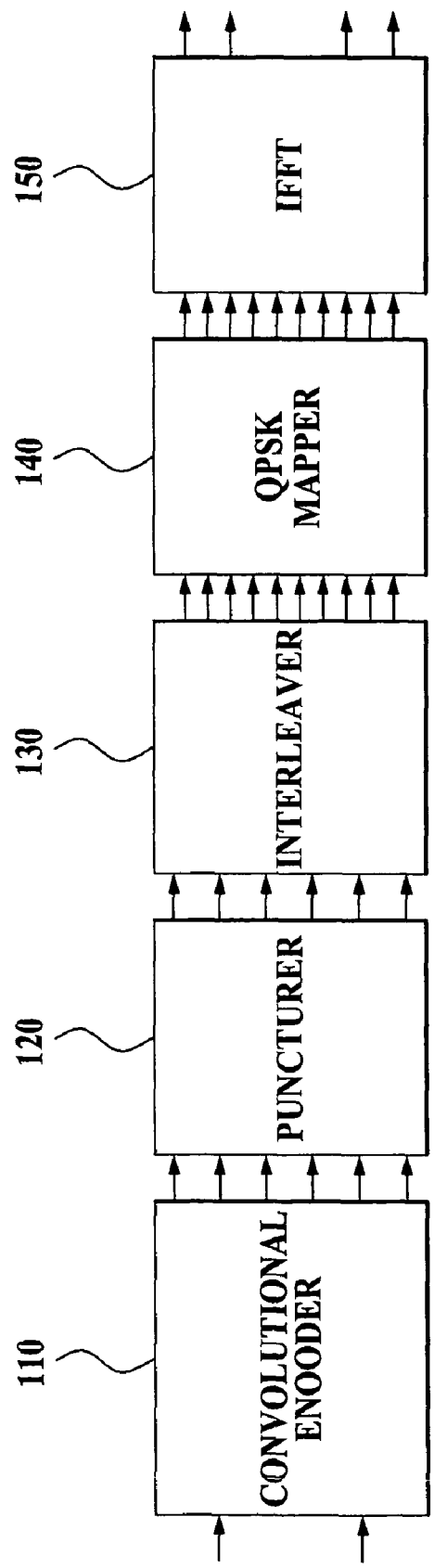
FIG. 1 is a block diagram illustrating a configuration of a transmitting side of a modem including a bit interleaver according to an exemplary embodiment of the present invention.

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

FIG. 1 is a block diagram illustrating a configuration of a transmitting side of a modem including a bit interleaver according to an exemplary embodiment of the present invention.

Referring to FIG. 1, a configuration of a WiMedia Wideband UWB modem includes a convolutional encoder 110, a puncturer 120, an interleaver 130, a quadrature phase shift keying (QPSK) mapper 140, and an inverse fast Fourier transformer (IFFT) 150.

The convolutional encoder 110 performs convolutional encoding of input data for error correction.

The puncturer 120 adjusts an encoding rate by punctuating an output of the convolutional encoder 110. Depending upon embodiments, at least two puncturers 120 may be provided. Also, the puncturer 120 may be omitted.

The interleaver 130 performs symbol interleaving, tone interleaving, and a cyclic shift.

Here, the interleaver 130 receives a 6 bit signal, and outputs a 10 bit signal. An output signal of the interleaver 130 is output into a predetermined format to perform QPSK mapping and IFFT.

FIG. 2 is a table illustrating an example of a 300 bit input stored in a memory when an interleaver operates in 53.3 Mbps.

Referring to FIG. 2, the memory includes 10 banks 210, 211, 212, 213, 214, 215, 216, 217, 218, and 219. Here, a bank number may be represented as j×2+i where i designates an integer of 0 or 1, and j designates an integer from 0 to 4. Specifically, the bank number is determined by i and j. As an example, when both i and j are 0, the bank number becomes 0. Also, when i is 1 and j is 2, the bank number becomes 5, and when i is 1 and j is 4, the bank number becomes 9.

Numbers as shown in FIG. 2 designate an order of input data. Specifically, number 0 to number 299 as shown in FIG. 2 designate first input data to 300$^{th}$ input data.

FIG. 3 is a table illustrating a result of symbol interleaving performed with respect to the 300 bit input as shown in FIG. 2.

Referring to FIG. 3, when performing symbol interleaving with respect to the 300 bit input as shown in FIG. 2, the 300 bit input data is classified into three groups. A first group 310 corresponds to a group of input data having a remainder of 0 when dividing an order of input data by 3. A second group 320 corresponds to a group of input data having a remainder of 1 when dividing an order of input data by 3, and a third group 330 corresponds to a group of input data having a remainder of 2 when dividing an order of input data by 3.

Specifically, symbol interleaving may be represented as, $$S(j)=U\{Floor(j/N_{CPBS})+3\ Mod(j,N_{CPBS})\}$$ [Equation 1]

Here, S( ) designates symbol interleaving, and U( ) designates input data. Also, $N_{CPBS}$ designates a number of coded bits per orthogonal frequency division multiplexing (OFDM) symbol. In FIG. 3, $N_{CPBS}$ is 100. Also, Floor( ) returns an integer that is less than a transmitted parameter, but nearest to the transmitted parameter, and Mod( ) returns a remainder of division.

FIG. 4 is a table illustrating a result of indicating the result of symbol interleaving as shown in FIG. 3 as index 0 to index 99.

Referring to FIG. 4, each of the first group 310, the second group 320, and the third group 330 as shown in FIG. 3 is indicated as index 0 to index 99.

Here, the quotient, acquired by dividing an order of input data by 3, is used as the index of each group.

Specifically, 0, 1, 2, 3, . . . , 99 corresponding to the quotient, acquired by dividing 0, 3, 6, 9, . . . , 297 by 3, becomes the index with respect to the first group 310 as shown in FIG. 3.

Also, 0, 1, 2, 3, . . . , 99 corresponding to the quotient, acquired by dividing 1, 4, 7, 10, . . . , 298 by 3, becomes the index with respect to the second group 320 as shown in FIG. 3.

Also, 0, 1, 2, 3, . . . , 99 corresponding to the quotient, acquired by dividing 2, 5, 8, 11, . . . , 299 by 3, becomes the index with respect to the third group 330 as shown in FIG. 3.

As described above, since each of three groups is indicated by identical indexes, bit interleaving according to an exemplary embodiment of the present invention may be easily described.

FIG. 5 is a table illustrating a result of tone interleaving performed with respect to the result as shown in FIG. 4.

Referring to FIG. 5, tone interleaving is performed with respect to each of groups as shown in FIG. 4. Here, tone interleaving is performed by a method of selecting one data for every 10 input data.

Specifically, tone interleaving may be represented as, $$T(j)=S\{Floor(j/10)+10\ Mod(j,10)\}$$ [Equation 2]

However, in a 106.67 Mbps, 110 Mbps, and 200 Mbps MB-OFDM system, tone interleaving may be represented as, $$T(j)=S\{Floor(j/20)+10\ Mod(j,20)\}$$ [Equation 3]

Figure 6:
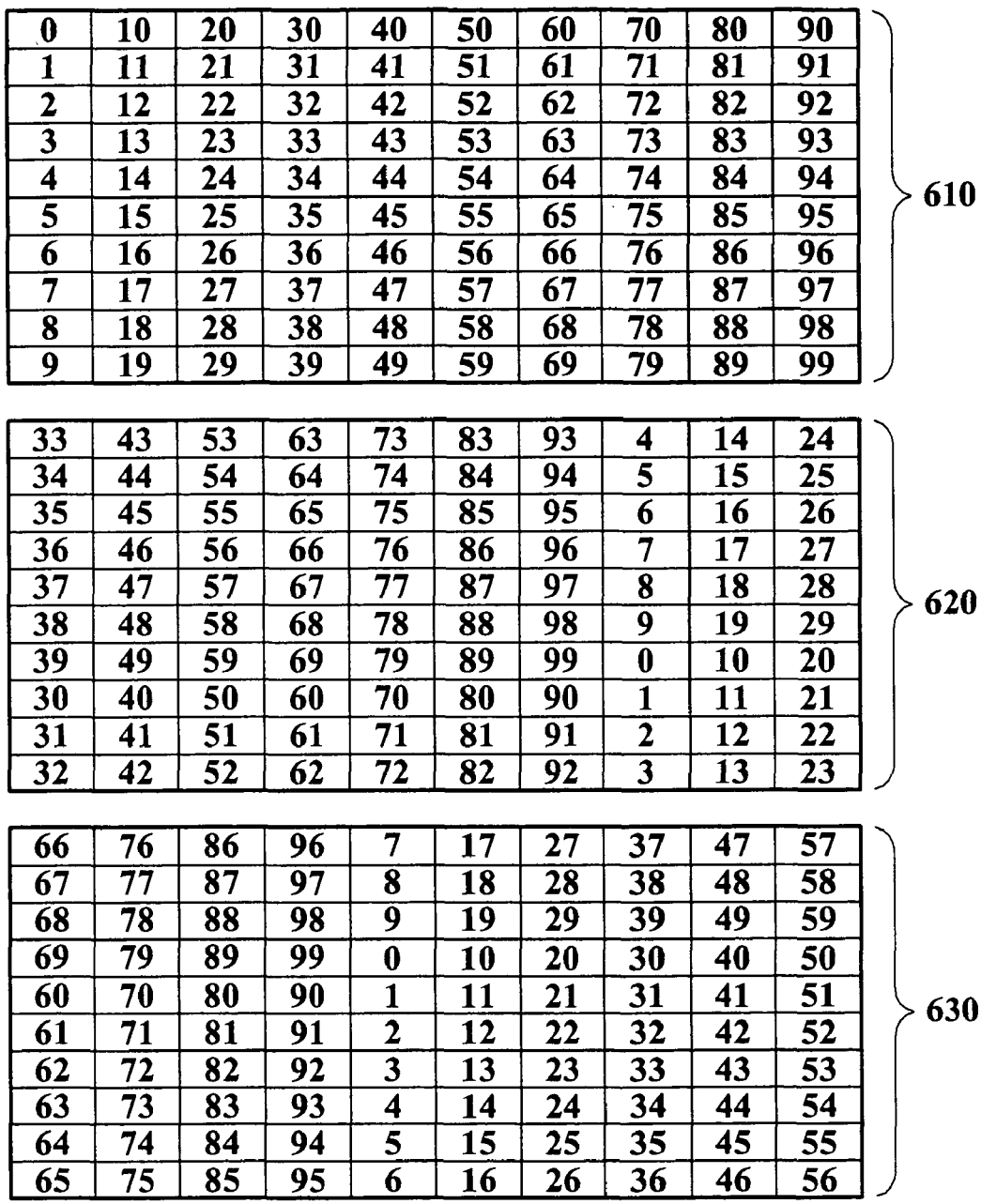
FIG. 6 is a table illustrating a result of a cyclic shift performed with respect to the result as shown in FIG. 5.

FIG. 6 is a table illustrating a result of a cyclic shift performed with respect to the result as shown in FIG. 5.

Referring to FIG. 6, a shift operation has not been performed with respect to a first group 510 as shown in FIG. 5, but the shift operation has been performed with respect to a second group 520 and a third group 530 as shown in FIG. 5.

Specifically, a second group 620 of FIG. 6 corresponds to a result of placing index 33 to index 99 in front of index 0 to index 23 with respect to the second group 520 of FIG. 5.

Also, a third group 630 of FIG. 6 corresponds to a result of placing index 66 to index 99 in front of index 0 to index 56.

Accordingly, it is possible to effectively prevent data loss, which is caused by a burst error, by performing a cyclic shift as described above.

FIG. 7 is a table illustrating an output bit stream of a bit interleaver according to an exemplary embodiment of the present invention.

Referring to FIG. 7, it can be seen that the bit interleaver outputs a bit stream of 10 bits (from out0 to out9) every clock for 20 clocks.

In the case of a first group 710, since the bit stream is output by 10 bits for 20 clocks, 100 bit data of the first group 610, as shown in FIG. 6, is output twice. As described above, according to the present invention, it is possible to have a system characteristic, which is robust against an error, by outputting 100 bit data twice. Also, 100 bit data of the first group 610 is sequentially output from an eleventh clock 10. Also, as shown in FIG. 7, a data order is changed and output for 10 clocks from the first clock 0 to the tenth clock 9.

Accordingly, the bit interleaver may easily perform QPSK mapping and IFFT by outputting a bit stream as described above.

Also, in the case of a second group 720, since the bit stream is output by 10 bits for 20 clocks, 100 bit data of the second group 620, as shown in FIG. 6, is output twice. As described above, according to the present invention, it is possible to have a system characteristic, which is robust against an error, by outputting 100 bit data twice. Also, 100 bit data of the second group 620 is sequentially output from an eleventh clock 10. Also, as shown in FIG. 7, a data order is changed and output for 10 clocks from a first clock 0 to a tenth clock 9.

Also, in the case of a third group 730, since the bit stream is output by 10 bits for 20 clocks, 100 bit data of the third group 630, as shown in FIG. 6, is output twice. As described above, according to the present invention, it is possible to have a system characteristic, which is robust against an error, by repeatedly outputting 100 bit data twice. Also, 100 bit data of the third group 630 is sequentially output from an eleventh clock 10. Also, as shown in FIG. 7, a data order is changed and output for 10 clocks from the first clock 0 to the tenth clock 9.

FIG. 8 is a table illustrating a bit stream output from a memory to generate the output bit stream as shown in FIG. 7.

Referring to FIG. 8, the bit interleaver according to the present invention generates the output bit stream, as shown in FIG. 7, by using a bit stream of 10 bits (from out0 to out9) which is output every clock for 20 clocks.

In the case of a first group 810, 100 bit data of the first group 610 as shown in FIG. 6 is sequentially output from the eleventh clock 10. As shown in FIG. 8, a data order is changed and output for 10 clocks from the first clock 0 to the tenth clock 9.

FIG. 9 is a table illustrating a memory control signal applied to output the first group 810 as shown in FIG. 8 from a memory.

Referring to FIG. 9, an even bank number address Even_Rd_Addr, an odd bank number address Odd_Rd_Addr, and a bit order bit_order are applied to the memory every clock, clock 0 to clock 19, as shown in FIG. 8.

As an example, referring to FIG. 8, 0, 10, 20, 30, 40, 50, 60, 70, 80, and 90 are output for the eleventh clock 10. In this case, 0 is applied to the even bank number address Even_Rd_Addr of the memory, 2 is applied to the odd bank number address Odd_Rd_Addr, and 0 is applied to the bit order bit_order.

Referring to FIG. 2, when an address addr of a bank having an even bank number of 0, and a bit order bit_order of 0, 0, 60, 120, 180, and 240 is output. Here, when indicating as the quotient that is acquired by dividing 0, 60, 120, 180, and 240 by 3, and 0, 20, 40, 60, and 80 is output. Also, when the address addr of the bank having an odd bank number of 2, and the bit order bit_order of 2, 30, 90, 150, 210, and 270 is output. Here, when indicating as the quotient that is acquired by dividing 30, 90, 150, 210, and 270 by 3, and 10, 30, 50, 70, and 90 is output.

Accordingly, when applying a control signal to the memory and appropriately selecting a bank as shown in FIG. 9, the output bit stream corresponding to the first group 810 may be acquired as shown in FIG. 8.

Figure 10:
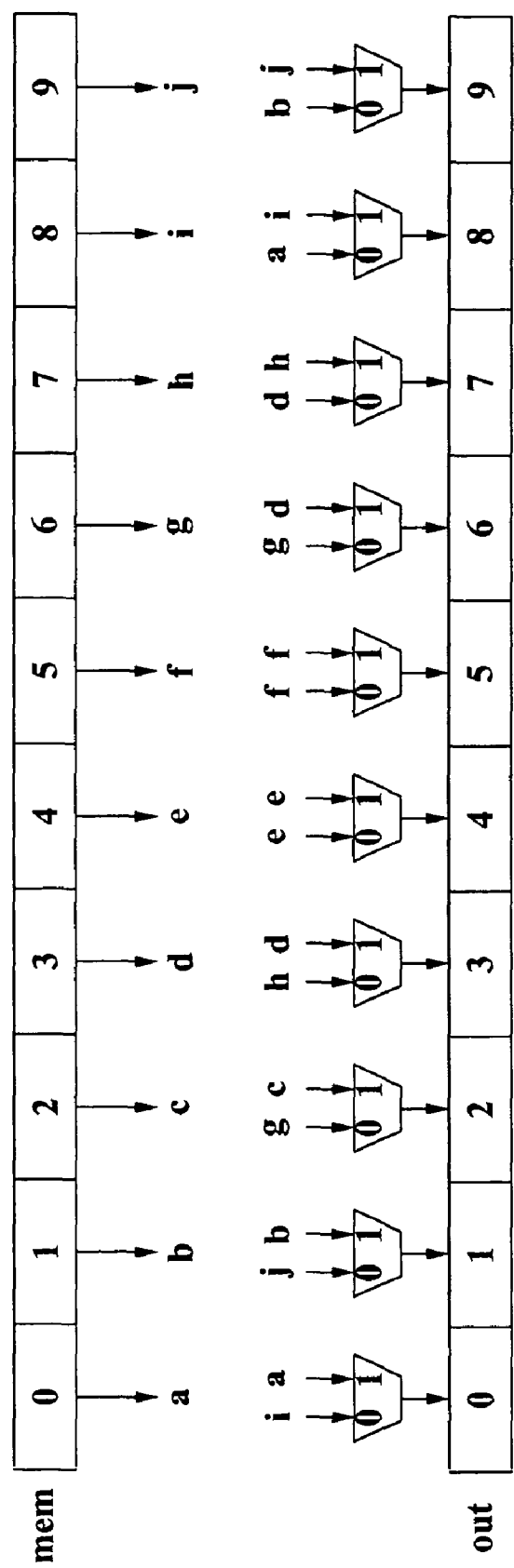
FIG. 10 is a block diagram illustrating a bit interleaver to generate an output bit stream with respect to a first group as shown in FIG. 7.

FIG. 10 is a block diagram illustrating a bit interleaver to generate an output bit stream with respect to the first group 710 as shown in FIG. 7.

Referring to FIG. 10, only an order of a bit stream to be output from the memory is required to be appropriately changed to generate the output bit stream with respect to the first group 710.

Accordingly, the bit interleaver as shown in FIG. 10 appropriately changes the order of the bit stream to be output from the memory by using 10 multiplexers. In FIG. 10, 10 multiplexers select an input signal corresponding to '0' for 10 clocks from the first clock 0 to the tenth clock 9, and select an input signal corresponding to '1' for another 10 clocks from the eleventh clock 10 to the twentieth clock 19.

Referring again to FIG. 8, in the case of the second group 820, an output bit stream may not be generated with only a bit stream output from the memory for a single clock. The output bit stream may be generated by appropriately combining the bit stream output from memory for two clocks.

As an example, with respect to the second group 820, data output from the memory for two clocks 0 and 1 must be combined like an identification numeral 821, or data output from the memory for two clocks 10 and 11 must be combined like an identification numeral 822.

Also, a portion of bits of the bit stream, which is most initially output from the memory, i.e. 3, 13, and 23, must be stored until the last clock 19, to generate an output bit stream of the last clock 19 as shown in FIG. 7.

FIG. 11 is a table illustrating a memory control signal applied to output the second group 820, as shown in FIG. 8, from a memory.

Referring to FIG. 11, an even bank number address Even_Rd_Addr, an odd bank number address Odd_Rd_Addr, and a bit order bit_order are applied to the memory every clock, clock 0 to clock 19, as shown in FIG. 8.

As an example, referring to FIG. 8, 3, 13, 23, 33, 43, 53, 63, 73, 83, and 93 is output the eleventh clock 10. In this case, 3 is applied to the even bank number address Even_Rd_Addr of the memory, 0 is applied to the odd bank number address Odd_Rd_Addr, and 4 is applied to the bit order bit_order.

Referring to FIG. 2, when an address addr of a bank having an even bank number is 3, and a bit order bit_order is 4, 40, 100, 160, 220, and 280 is output. Here, when indicting as the quotient that is acquired by dividing 40, 100, 160, 220, and 280 by 3, and 13, 33, 53, 73, and 93 is output. Also, when the address addr of the bank having an odd bank number is 0, and the bit order bit_order is 4, 10, 70, 130, 190, and 250 is output. Here, when indicating as the quotient that is acquired by 10, 70, 130, 190, and 250 by 3, and 3, 23, 43, 63, and 83 is output.

Accordingly, when applying a control signal to the memory and appropriately selecting a bank as shown in FIG. 11, the output bit stream corresponding to the second group 820 may be acquired as shown in FIG. 8.

Figure 12:
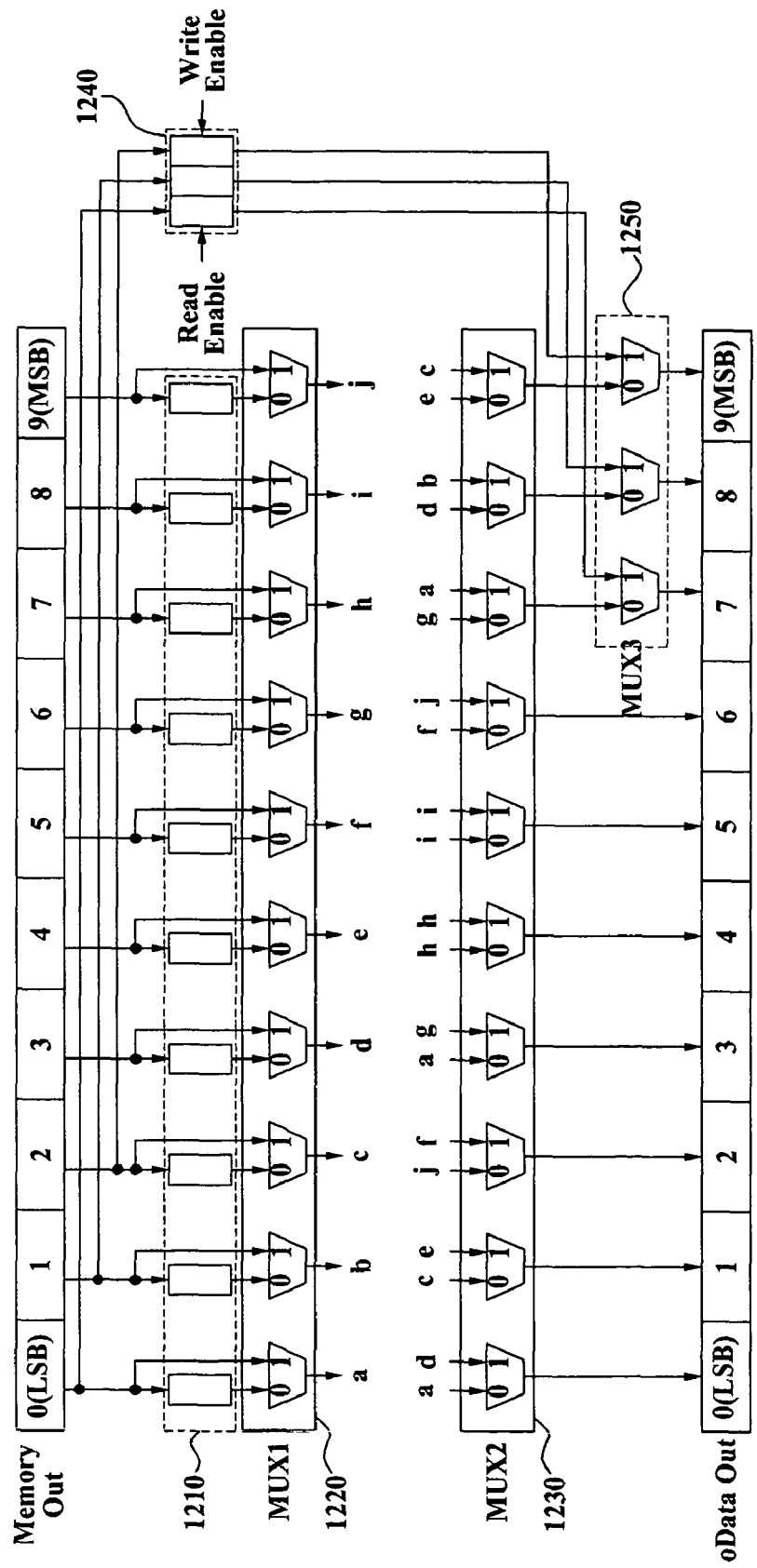
FIG. 12 is a block diagram illustrating a bit interleaver to generate an output bit stream with respect to a second group as shown in FIG. 7.

FIG. 12 is a block diagram illustrating a bit interleaver for generating an output bit stream with respect to the second group 720, as shown in FIG. 7.

Referring to FIG. 12, the bit interleaver, according to an exemplary embodiment of the present invention, includes delay devices 1210, a first MUX unit 1220, a second MUX unit 1230, a third MUX unit 1250, and a register 1240.

As described with FIGS. 3 through 6, the delay devices 1210 are applied with symbol interleaving and tone interleaving, delay a bit stream output from a memory, and generate a delayed bit stream.

Here, the memory outputs a bit stream corresponding to an index having an identical number in a one's column. As an example, the memory may output the bit stream corresponding to 0, 10, 20, 30, 40, 50, 60, 70, 80, and 90 having 0 in the one's column.

The first MUX unit 1220 selects any one of a bit of the bit stream output from the memory and a bit of the delayed bit stream, and generates a selection bit stream.

In this case, when selecting a bit corresponding to the bit stream output from the memory with respect to bits corresponding to bits stored in the register 1240 among the bit stream output from the memory, the first MUX unit 1220 selects a bit corresponding to the delayed bit stream with respect to bits not corresponding to the bits stored in the register 1240.

Specifically, as shown in FIG. 12, when multiplexers corresponding to a, b, and c output an input signal corresponding to '1', multiplexers corresponding to d, e, f, g, h, i, and j output an input signal corresponding to '0'. Also, when the multiplexers corresponding to a, b, and c output an input signal corresponding to '0', the multiplexers corresponding to d, e, f, g, h, i, and j output an input signal corresponding to '1'.

The second MUX unit 1230 generates an output bit stream by changing an order of the selection bit stream.

In an example shown in FIG. 12, the first MUX unit 1220 and the second MUX unit 1230 include 10 multiplexers.

In this case, the first MUX unit 1220 and the second MUX unit 1230 select an input signal corresponding to '0' for 10 clocks from the first clock 0 to the tenth clock 9, and select an input signal corresponding to '1' for another 10 clocks from the eleventh clock 10 to the twentieth clock 19.

The register 1240 stores a portion of the bits of a previous bit stream output from the memory, a nineteenth clock before the bit stream is output from the memory.

Specifically, the register 1240 stores a bit stream output from the memory in the first clock 0, and maintains the stored bit stream until the twentieth clock 19, and appropriately combines the stored bit stream with a bit stream output from the memory for the twentieth clock 19, to generate the output bit stream.

Also, the register 1240 performs writing for the first clock 0, and performs reading for the last clock 19.

The third MUX unit 1250 selects any one of the outputs of the register 1240 and a portion of the output bits of the second MUX unit 1230, and generates the output bit stream.

The third MUX unit 1250 generates three higher bits, for example, 7, 8, and 9, of the output bit stream by using three lower bits, for example, 0, 1, and 2, of the previous bit stream.

The third MUX unit 1250 selects an input signal corresponding to '1' for only the last clock 19, and selects an input signal corresponding to '0' for remaining clocks.

Referring again to FIG. 8, in the case of the third group 830, an output bit stream may not be generated with only a bit stream output from the memory for a single clock. The output bit stream may be generated by appropriately combining the bit stream output from memory for two clocks.

As an example, with respect to the third group 830, data output from the memory for two clocks 0 and 1 must be combined like an identification numeral 831, or data output from the memory for two clocks 10 and 11 must be combined like an identification numeral 832.

Also, a portion of the bits of the bit stream, which is initially output from the memory, i.e. 6, 16, 26, 36, 46, and 56, must be stored until the last clock 19, to generate an output bit stream of the last clock 19 as shown in FIG. 7.

FIG. 13 is a table illustrating a memory control signal applied to output the third group 830 as shown in FIG. 8, from a memory.

Referring to FIG. 13, an even bank number address Even_Rd_Addr, an odd bank number address Odd_Rd_Addr, and a bit order bit_order are applied to the memory every clock, from clock 0 to clock 19, as shown in FIG. 8.

As an example, referring to FIG. 8, the 6, 16, 26, 36, 46, 56, 66, 76, 86, and 96 is output for the eleventh clock 10. In this case, 4 is applied to the even bank number address Even_Rd_Addr of the memory, 1 is applied to the odd bank number address Odd_Rd_Addr, and 2 is applied to the bit order bit_order.

Referring to FIG. 2, when an address addr of a bank having an even bank number of 4, and a bit order bit_order of 2, 50, 110, 170, 230, and 290 is output. Here, when indicating as the quotient that is acquired by dividing 50, 110, 170, 230, and 290 by 3, and 16, 36, 56, 76, and 96 is output. Also, when the address addr of the bank having an odd bank number of 1, and the bit order bit_order of 2, 20, 80, 140, 200, and 260 is output. Here, when indicating as the quotient that is acquired by dividing 20, 80, 140, 200, and 260 by 3, and 6, 26, 46, 66, and 86 is output.

Accordingly, when applying a control signal to the memory and appropriately selecting a bank as shown in FIG. 13, the output bit stream corresponding to the third group 830 may be acquired as shown in FIG. 8.

Figure 14:
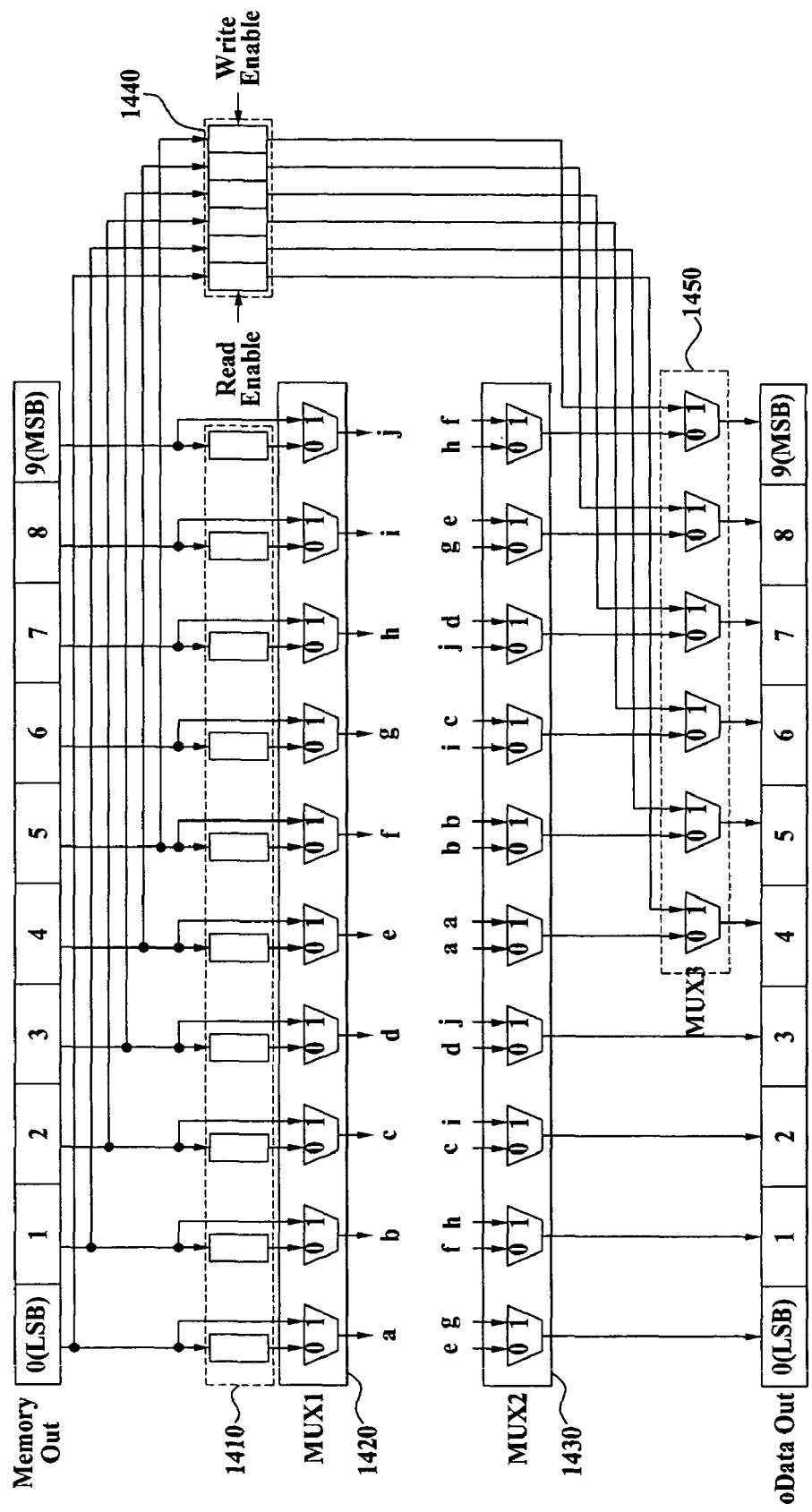
FIG. 14 is a block diagram illustrating a bit interleaver to generate an output bit stream with respect to a third group as shown in FIG. 7.

FIG. 14 is a block diagram illustrating a bit interleaver to generate an output bit stream with respect to the third group 730 as shown in FIG. 7.

Referring to FIG. 14, the bit interleaver according to an exemplary embodiment of the present invention includes delay devices 1410, a first MUX unit 1420, a second MUX unit 1430, a third MUX unit 1450, and a register 1440.

As described with FIGS. 3 through 6, the delay devices 1410 are applied with symbol interleaving and tone interleaving, delay a bit stream output from a memory, and generate a delayed bit stream.

Here, the memory outputs a bit stream corresponding to an index having an identical number in a one's column. As an example, the memory may output the bit stream corresponding to 0, 10, 20, 30, 40, 50, 60, 70, 80, and 90 having 0 in the one's column.

The first MUX unit 1420 selects any one of a bit of the bit stream output from the memory and a bit of the delayed bit stream, and generates a selection bit stream.

In this case, when selecting a bit corresponding to the bit stream output from the memory with respect to bits corresponding to the bits stored in the register 1440 among the bit stream output from the memory, the first MUX unit 1420 selects a bit corresponding to the delayed bit stream with respect to bits not corresponding to the bits stored in the register 1440.

Specifically, as shown in FIG. 14, when multiplexers corresponding to a, b, c, d, e, and f output an input signal corresponding to '1', multiplexers corresponding to g, h, i, and j output an input signal corresponding to '0'. Also, when the multiplexers corresponding to a, b, c, d, e, and f output an input signal corresponding to '0', the multiplexers corresponding to g, h, i, and j output an input signal corresponding to '1'.

The second MUX unit 1430 generates an output bit stream by changing the order of the selection bit stream.

In an example shown in FIG. 14, each of the first MUX unit 1420 and the second MUX unit 1430 include 10 multiplexers.

In this case, the first MUX unit 1420 and the second MUX unit 1430 select an input signal corresponding to '0' for 10 clocks from the first clock 0 to the tenth clock 9, and select an input signal corresponding to '1' for another 10 clocks from the eleventh clock 10 to the twentieth clock 19.

The register 1440 stores a portion of bits of a previous bit stream output from the memory, a nineteenth clock before the bit stream is output from the memory.

Specifically, the register 1440 stores a bit stream output from the memory in the first clock 0, and maintains the stored bit stream until the twentieth clock 19, and appropriately combines the stored bit stream with a bit stream output from the memory in the twentieth clock 19, to generate the output bit stream. Also, the register 1440 performs writing for the first clock 0, and performs reading for the last clock 19.

The third MUX unit 1450 selects any one of an output of the register 1440 and a portion of output bits of the second MUX unit 1430, and generates the output bit stream.

The third MUX unit 1450 generates six higher bits, for example, 4, 5, 6, 7, 8, and 9, of the output bit stream by using six lower bits, for example, 0, 1, 2, 3, 4, and 5, of the previous bit stream.

The third MUX unit 1450 selects an input signal corresponding to '1' for only the last clock 19, and selects an input signal corresponding to '0' for remaining clocks.

FIG. 15 is a table illustrating an example of a 600 bit input stored in a memory when an interleaver operates in 106.7 Mbps or 200 Mbps.

Referring to FIG. 15, the memory includes 10 banks 1510, 1511, 1512, 1513, 1514, 1515, 1516, 1517, 1518, and 1519. Here, a bank number may be represented as j×2+i where i designates an integer, either 0 and 1, and j designates an integer from 0 to 4. Specifically, the bank number is determined by i and j. As an example, when both i and j are 0, the bank number becomes 0. Also, when i is 1 and j is 2, the bank number becomes 5, and when i is 1 and j is 4, the bank number becomes 9.

Numbers as shown in FIG. 15 designate an order of input data. Specifically, number 0 to number 599 as shown in FIG. 15 designates first input data to 600$^{th}$ input data.

FIG. 16 is a table illustrating a result of symbol interleaving performed with respect to the 600 bit input as shown in FIG. 15.

Referring to FIG. 16, when performing symbol interleaving with respect to the 600 bit input as shown in FIG. 15, the 600 bit input data is classified into three groups. A first group 1610 corresponds to a group of input data having a remainder of 0 when dividing an order of input data by 3. A second group 1620 corresponds to a group of input data having a remainder of 1 when dividing an order of input data by 3, and a third group 1630 corresponds to a group of input data having a remainder of 2 when dividing an order of input data by 3.

As described above, symbol interleaving may be represented as equation 1.

FIG. 17 is a table illustrating a result of indicating the result of symbol interleaving as shown in FIG. 16 as index 0 to index 199.

Referring to FIG. 17, each of the first group 1610, the second group 1620, and the third group 1630 as shown in FIG. 16 is indicated as index 0 to index 199.

Here, the quotient, acquired by dividing an order by 3, is used as the index of each group.

Specifically, 0, 1, 2, 3, . . . , 199 corresponding to the quotient, acquired by dividing 0, 3, 6, 9, . . . , 597 by 3, becomes the index with respect to the first group 1610 as shown in FIG. 16.

Also, 0, 1, 2, 3, . . . , 199 corresponding to the quotient, acquired by dividing 1, 4, 7, 10, . . . , 598 by 3, becomes the index with respect to the second group 1620 as shown in FIG. 16.

Also, 0, 1, 2, 3, . . . , 199 corresponding to the quotient, acquired by dividing 2, 5, 8, 11, . . . , 599 by 3, becomes the index with respect to the third group 1630 as shown in FIG. 16.

As described above, since each of three groups is indicated by identical indexes, bit interleaving according to an exemplary embodiment of the present invention may be easily described.

FIG. 18 is a table illustrating a result of tone interleaving performed with respect to the result as shown in FIG. 17.

Referring to FIG. 18, tone interleaving is performed with respect to each of groups as shown in FIG. 17. Here, tone interleaving is performed by a method of selecting one data for every 10 input data.

As described above, tone interleaving may be represented as equation 3.

FIG. 19 is a table illustrating a result of a cyclic shift performed with respect to the result as shown in FIG. 18.

Referring to FIG. 19, a shift operation has not been performed with respect to a first group 1810 as shown in FIG. 18, but the shift operation has been performed with respect to a second group 1820 and a third group 1830 as shown in FIG. 18.

Specifically, a second group 1920 of FIG. 19 corresponds to a result of placing index 63 to index 199 in front of index 0 to index 53 with respect to the second group 1820 of FIG. 18.

Also, a third group 1930 of FIG. 19 corresponds to a result of placing index 126 to index 199 in front of index 0 to index 116.

Accordingly, it is possible to effectively prevent data loss, which is caused by a burst error, by performing a cyclic shift as described above.

FIG. 20 is a table illustrating an output bit stream of a bit interleaver according to an exemplary embodiment of the present invention.

Referring to FIG. 20, it can be seen that the bit interleaver outputs a bit stream of 10 bits every clock for 20 clocks.

In the case of a first group 2010, since the bit stream is output by 10 bits for 20 clocks, 200 bit data of the first group 1910, as shown in FIG. 19, is output twice. An output order of the output bit stream is shown in FIG. 20.

Also, in the case of a second group 2020, since the bit stream is output by 10 bits for 20 clocks, 200 bit data of the second group 1920, as shown in FIG. 19, is output twice. An output order of the output bit stream is shown in FIG. 20.

Also, in the case of a third group 2030, since the bit stream is output by 10 bits for 20 clocks, 200 bit data of the third group 1930, as shown in FIG. 19, is output twice. An output order of the output bit stream is shown in FIG. 20.

FIG. 21 is a table illustrating a bit stream output from a memory to generate the output bit stream as shown in FIG. 20.

Referring to FIG. 21, the bit interleaver according to the present invention generates the output bit stream as shown in FIG. 20 by using a bit stream (of 10 bits from out0 to out9) which is output every clock for 20 clocks.

In the case of a first group 2110, 100 bit data of the first group 1910 as shown in FIG. 19 is sequentially output from the eleventh clock 10. Data is output in an order, as shown in FIG. 21, for 10 clocks from the first clock 0 to the tenth clock 9.

FIG. 22 is a table illustrating a memory control signal applied to output the first group 2110 as shown in FIG. 21 from a memory.

Referring to FIG. 22, an even bank number address Even_Rd_Addr, an odd bank number address Odd_Rd_Addr, and a bit order bit_order are applied to the memory every clock, clock 0 to clock 19, as shown in FIG. 21.

As an example, referring to FIG. 21, 0, 10, 20, 30, 40, 50, 60, 70, 80, and 90 is output for the eleventh clock 10. In this case, 0 is applied to the even bank number address Even_Rd_Addr of the memory, 2 is applied to the odd bank number address Odd_Rd_Addr, and 0 is applied to the bit order bit_order.

Referring to FIG. 15, when an address addr of a bank having an even bank number of 0, and a bit order bit_order of 0, 0, 60, 120, 180, and 240 is output. Here, when indicating as the quotient that is acquired by dividing 0, 60, 120, 180, and 240 by 3, and 0, 20, 40, 60, and 80 is output. Also, when the address addr of the bank having an odd bank number of 2, and the bit order bit_order of 2, 30, 90, 150, 210, and 270 is output. Here, when representing the quotient that is acquired by dividing 30, 90, 150, 210, and 270 by 3, and 10, 30, 50, 70, and 90 is output.

Accordingly, when applying a control signal to the memory and appropriately selecting a bank as shown in FIG. 22, the output bit stream corresponding to the first group 2110 may be acquired as shown in FIG. 21.

Specifically, in the bit interleaver for generating an output bit stream with respect to the first group 2010 of FIG. 20, a bit stream output from the memory becomes the output bit stream as is.

Referring again to FIG. 21, in the case of the second group 2120, an output bit stream may not be generated with only a bit stream output from the memory for a single clock. The output bit stream may be generated by appropriately combining the bit stream output from memory for two clocks.

As an example, with respect to the second group 2120, data output from the memory for two clocks 0 and 1 must be combined like an identification numeral 2121.

Also, a portion of bits of the bit stream, which is most initially output from the memory, i.e. 8, 18, 28, 38, 48, and 58, must be stored until the last clock 19, to generate an output bit stream of the last clock 19 as shown in FIG. 20.

FIG. 23 is a table illustrating a memory control signal applied to output the second group 2120 as shown in FIG. 21 from a memory.

Referring to FIG. 23, an even bank number address Even_Rd_Addr, an odd bank number address Odd_Rd_Addr, and a bit order bit_order are applied to the memory every clock, clock 0 to clock 19, as shown in FIG. 21.

As an example, referring to FIG. 21, a 3, 13, 23, 33, 43, 53, 63, 73, 83, and 93 is output for the eleventh clock 10. In this case, 3 is applied to the even bank number address Even_Rd_Addr of the memory, 0 is applied to the odd bank number address Odd_Rd_Addr, and 4 is applied to the bit order bit_order.

Referring to FIG. 15, when an address addr of a bank having an even bank number of 3, and a bit order bit order of 4, 40, 100, 160, 220, and 280 is output. Here, when indicating as the quotient that is acquired by dividing 40, 100, 160, 220, and 280 by 3, and 13, 33, 53, 73, and 93 is output. Also, when the address addr of the bank having an odd bank number of 0, and the bit order bit_order of 4, 10, 70, 130, 190, and 250 is output. Here, when indicating as the quotient that is acquired by dividing 10, 70, 130, 190, and 250 by 3, and 3, 23, 43, 63, and 83 is output.

Accordingly, when applying a control signal to the memory and appropriately selecting a bank as shown in FIG. 23, the output bit stream corresponding to the second group 2120 may be acquired as shown in FIG. 21.

Figure 24:
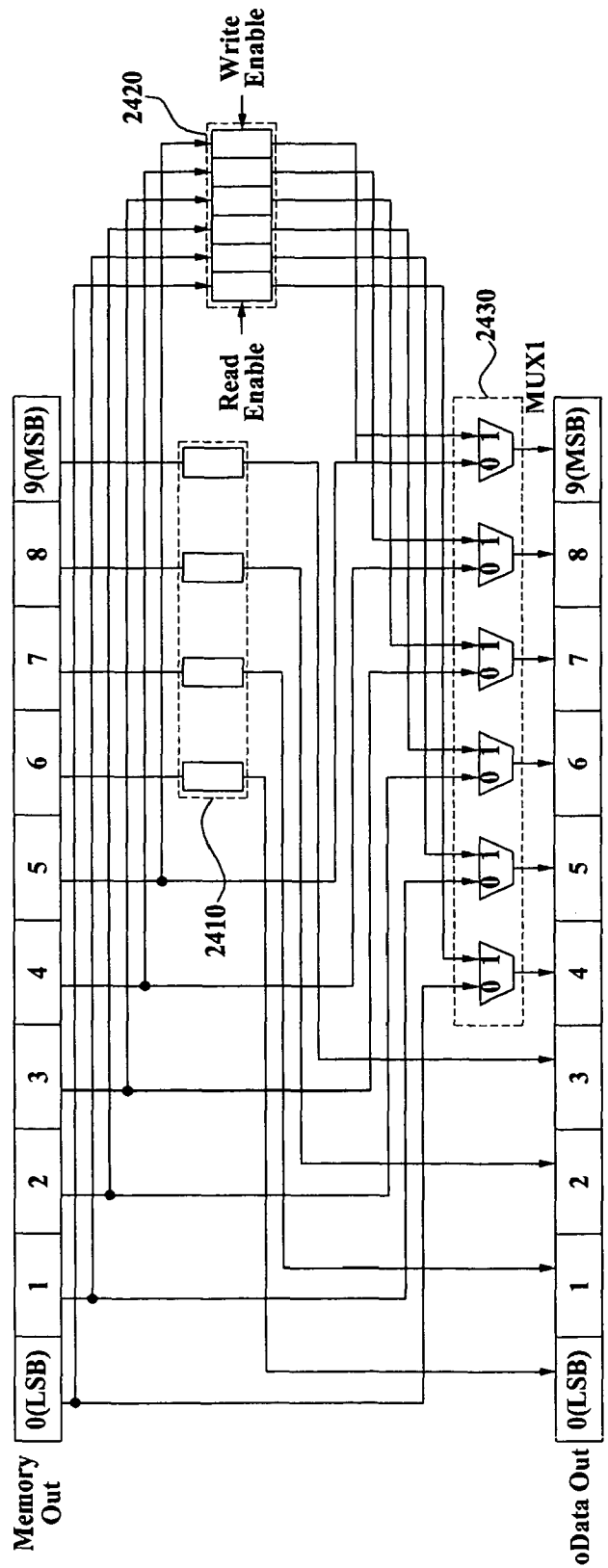
FIG. 24 is a block diagram illustrating a bit interleaver to generate an output bit stream with respect to a second group as shown in FIG. 20.

FIG. 24 is a block diagram illustrating a bit interleaver to generate an output bit stream with respect to the second group 2020 as shown in FIG. 20.

Referring to FIG. 24, the bit interleaver according to an exemplary embodiment of the present invention includes delay devices 2410, a register 2420, and a MUX unit 2430.

As described with FIGS. 16 through 19, the delay devices 2410 are applied with symbol interleaving and tone interleaving and delays a portion, for example, 6, 7, 8, and 9, of bits of a bit stream output from a memory, and generate a delayed bit stream.

Here, the memory outputs a bit stream corresponding to an index having an identical number in a one's column. As an example, the memory may output the bit stream corresponding to 0, 10, 20, 30, 40, 50, 60, 70, 80, and 90 having 0 in the one's column.

The register 2420 stores a portion of bits of a previous bit stream output from the memory, a nineteenth clock before the bit stream is output from the memory.

Specifically, the register 2420 stores a bit stream output from the memory in the first clock 0, and maintains the stored bit stream until the twentieth clock 19, and appropriately combines the stored bit stream with a bit stream output from the memory for the twentieth clock 19, to generate the output bit stream.

Also, the register 2420 performs writing for the first clock 0, and performs reading for the last clock 19.

The MUX unit 2430 selects any one of an output of the register 2420 and bits, for example, 0, 1, 2, 3, 4, and 5, corresponding to a bit stream. Here, the bit stream is not delayed by the delay devices and output from the memory.

The bit interleaver as shown in FIG. 24 generates an output bit stream by using an output of the delay devices 2410 and the MUX unit 2430.

In this case, the memory may output a bit stream of 10 bits, and an addition of a number of bits corresponding to the delay devices 2410 and a number of bits corresponding to the register 2420 may be 10.

The MUX unit 2430 includes six multiplexers.

Here, the MUX unit 2430 selects an input signal corresponding to '0' for nineteen clocks from a first clock 0 to a nineteenth clock 18, and selects an input signal corresponding to '1' for a twentieth clock 19.

The MUX unit 2430 generates six higher bits, for example, 4, 5, 6, 7, 8, and 9, of the output bit stream by using six lower bits, for example, 0, 1, 2, 3, 4, and 5, of the previous bit stream.

Referring again to FIG. 21, in the case of the third group 2130, an output bit stream may not be generated with only a bit stream output from the memory for a single clock. The output bit stream may be generated by appropriately combining the bit stream output from memory for two clocks.

As an example, with respect to the third group 2130, data output from the memory for two clocks 0 and 1 must be combined like an identification numeral 2131.

Also, a portion of the bits of the bit stream, which is initially output from the memory, i.e. 101 and 111, must be stored until the last clock 19, to generate an output bit stream of the last clock 19 as shown in FIG. 20.

FIG. 25 is a table illustrating a memory control signal applied to output the third group 2130 as shown in FIG. 21 from a memory.

Referring to FIG. 25, an even bank number address Even_Rd_Addr, an odd bank number address Odd_Rd_Addr, and a bit order bit_order are applied to the memory every clock, clock 0 to clock 19, as shown in FIG. 21.

As an example, referring to FIG. 21, 106, 116, 126, 136, 146, 156, 166, 176, 186, a 196 is output for the eleventh clock 10. In this case, 9 is applied to the even bank number address Even_Rd_Addr of the memory, 6 is applied to the odd bank number address Odd_Rd_Addr, and 2 is applied to the bit order bit_order.

Referring to FIG. 15, when an address addr of a bank having an even bank number of 9, and a bit order bit_order of 2, 350, 410, 470, 530, and 590 is output. Here, when indicating the quotient that is acquired by dividing 350, 410, 470, 530, and 590 by 3, and 116, 136, 156, 176, and 196 is output. Also, when the address addr of the bank having an odd bank number of 6, and the bit order bit_order of 2, 320, 380, 440, 500, and 560 is output. Here, when indicating the quotient that is acquired by dividing 320, 380, 440, 500, and 560 by 3, and 106, 126, 146, 166, and 186 is output.

Accordingly, when applying a control signal to the memory and appropriately selecting a bank as shown in FIG. 25, the output bit stream corresponding to the third group 2130 may be acquired, as shown in FIG. 21.

Figure 26:
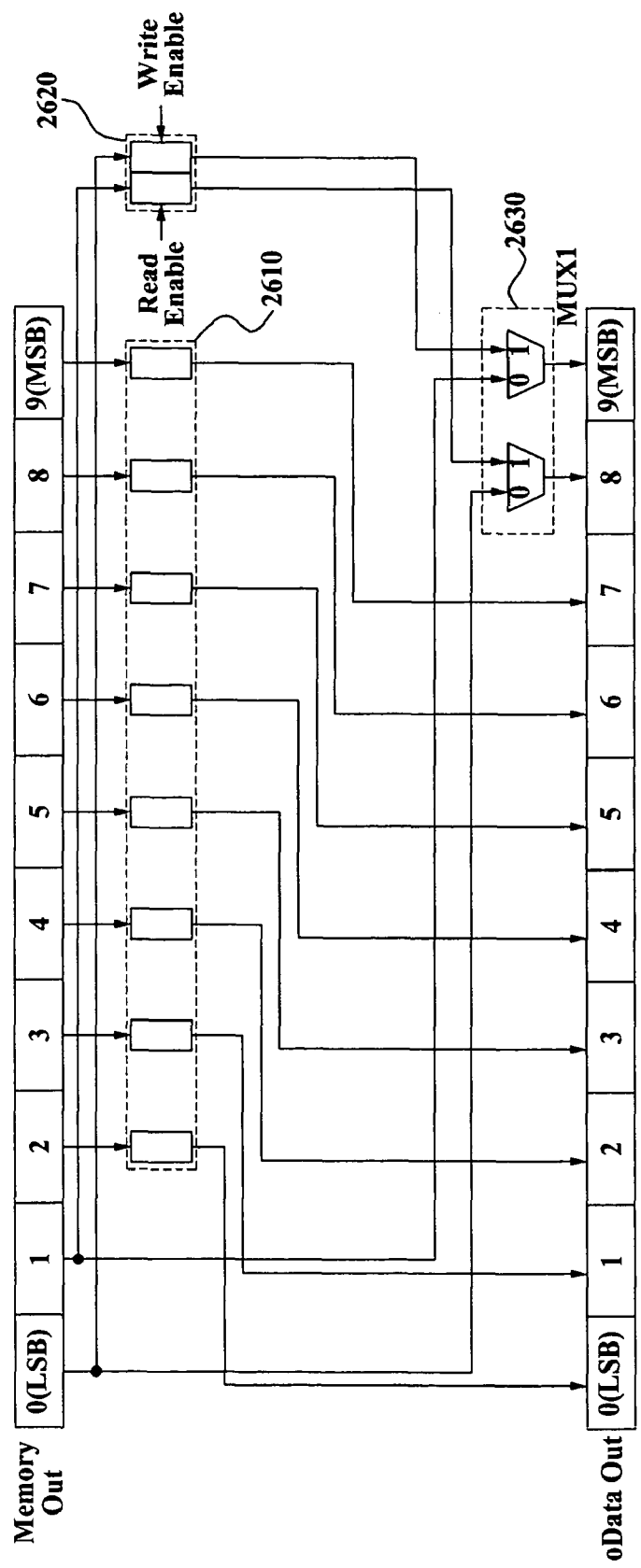
FIG. 26 is a block diagram illustrating a bit interleaver to generate an output bit stream with respect to a third group as shown in FIG. 20.

FIG. 26 is a block diagram illustrating a bit interleaver to generate an output bit stream with respect to the third group 2030, as shown in FIG. 20.

Referring to FIG. 26, the bit interleaver according to an exemplary embodiment of the present invention includes delay devices 2610, a register 2620, and a MUX unit 2630.

As described with FIGS. 16 through 19, the delay devices 2610 are applied with symbol interleaving and tone interleaving and delays a portion, for example, 2, 3, 4, 5, 6, 7, 8, and 9, of bits of a bit stream output from a memory, and generate a delayed bit stream.

Here, the memory outputs a bit stream corresponding to an index having an identical number in a one's column. As an example, the memory may output the bit stream corresponding to 0, 10, 20, 30, 40, 50, 60, 70, 80, and 90 having 0 in the one's column.

The register 2620 stores a portion of bits of a previous bit stream output from the memory, a nineteenth clock before the bit stream is output from the memory.

Specifically, the register 2620 stores a bit stream output from the memory in the first clock 0, and maintains the stored bit stream until the twentieth clock 19, and appropriately combines the stored bit stream with a bit stream output from the memory for the twentieth clock 19, to generate the output bit stream.

Also, the register 2620 performs writing for the first clock 0, and performs reading for the last clock.

The MUX unit 2630 selects any one of an output of the register 2620 and bits, for example, 0 and 1, corresponding to a bit stream. Here, the bit stream is not delayed by the delay devices and output from the memory The bit interleaver as shown in FIG. 26 generates an output bit stream by using an output of the delay devices 2610 and the MUX unit 2630.

In this case, the memory may output a bit stream of 10 bits, and an addition of a number of bits corresponding to the delay devices 2610 and a number of bits corresponding to the register 2620 may be 10. Specifically, bits, which are not inputted into the delay devices 2610 from the bit stream output from the memory, are inputted into the register 2620.

The MUX unit 2630 includes two multiplexers.

Here, the MUX unit 2630 selects an input signal corresponding to '0' for nineteen clocks from a first clock 0 to a nineteenth clock 18, and selects an input signal corresponding to '1' for a twentieth clock 19.

The MUX unit 2630 generates two higher bits, for example, 8 and 9, of the output bit stream by using two lower bits, for example, 0 and 1, of the previous bit stream.

Figure 27:
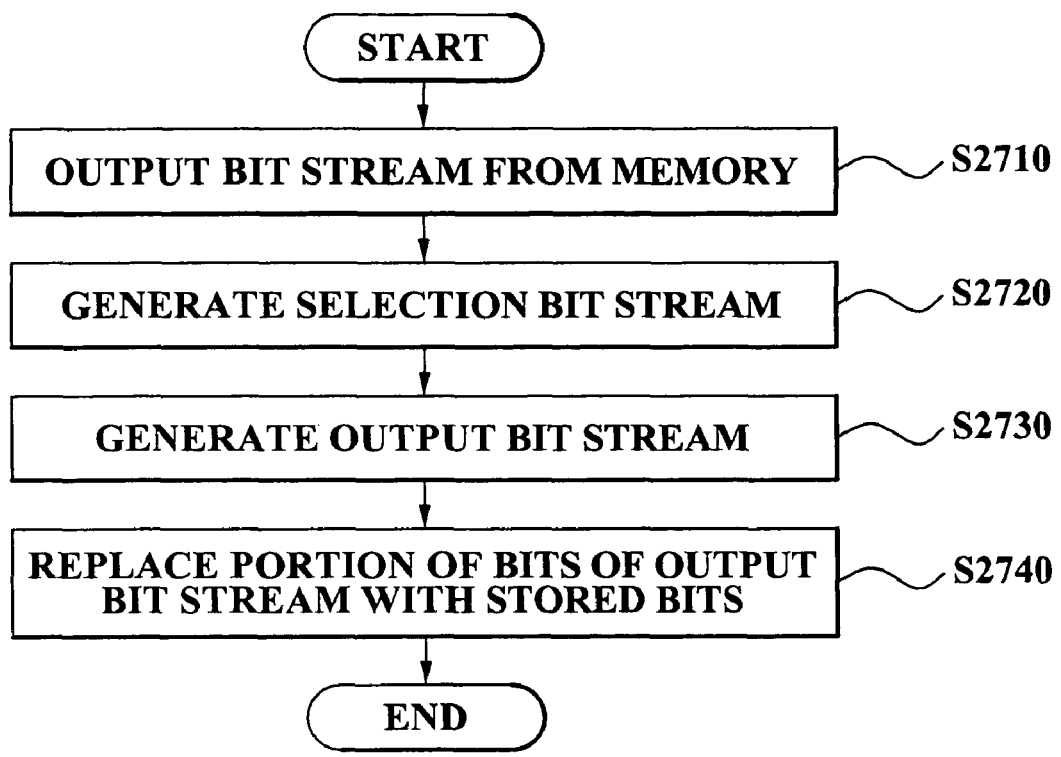
FIG. 27 is a flowchart illustrating a bit interleaving method according to an exemplary embodiment of the present invention.

FIG. 27 is a flowchart illustrating a bit interleaving method according to an exemplary embodiment of the present invention.

Referring to FIG. 27, in operation S2710, the bit interleaving method according to the present exemplary embodiment outputs a bit stream corresponding to a result of symbol interleaving and tone interleaving, from a memory.

Also, in operation S2710, the bit interleaving method may output bits corresponding to indexes having an identical number in a one's column as the bit stream.

In operation S2720, the bit interleaving method selects any one of a bit of the bit stream output from the memory and a bit of a delayed bit stream, which is acquired by delaying the bit stream, and generates a selection bit stream.

In operation S2730, the bit interleaving method generates an output bit stream by changing an order of the selection bit stream.

In operation S2740, the bit interleaving method stores a portion of bits of a previous bit stream output from the memory, a predetermined clock before the bit stream is output from the memory, and replaces a portion of the bits of the output bit stream with the stored bits.

Also, in operation S2740, the bit interleaving method may generate a predetermined number of higher bits of the output bit stream by using a predetermined number of lower bits of the previous bit stream.

Figure 28:
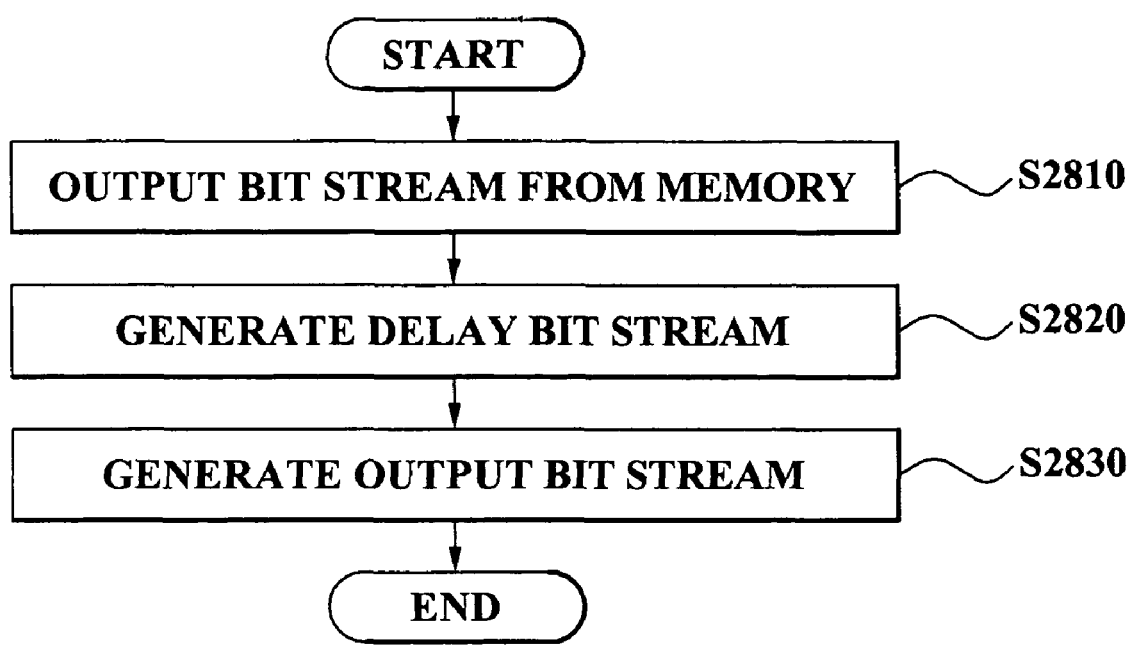
FIG. 28 is a flowchart illustrating a bit interleaving method according to another exemplary embodiment of the present invention.

FIG. 28 is a flowchart illustrating a bit interleaving method according to another embodiment of the present invention.

Referring to FIG. 28, in operation S2810, the bit interleaving method according to the present exemplary embodiment outputs a bit stream corresponding to a result of symbol interleaving and tone interleaving, from a memory.

In operation S2820, the bit interleaving method generates a delaedy bit stream by delaying a portion of bits of the bit stream output from the memory.

In operation S2830, the bit interleaving method generates an output bit stream by storing a portion of bits of a previous bit stream output from the memory, a predetermined clock before the bit stream is output from the memory, and replaces a portion of the bits of the output bit stream with the stored bits.

Descriptions related to a bit interleaver may be applicable to the method as shown in FIGS. 27 and 28.

As described above, according to the present invention, it is possible to easily and effectively perform bit interleaving including a cyclic shift.

Also, according to the present invention, it is possible to effectively embody a bit interleaver which can satisfy requirements of at least WiMedia Ultra-Wideband physical layer specification (UWB PHY) spec 1.0.

Also, according to the present invention, it is possible to easily perform a cyclic shift operation by using an output feature of results of symbol interleaving and tone interleaving.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A bit interleaver comprising:
a plurality of delay devices which are provided with a bit stream output from a memory, the bit stream being symbol-interleaved and tone interleaved, and delay the bit stream output to generate a delayed bit stream;
a first MUX unit which selects one of a bit of the bit stream output from the memory and a bit of the delayed bit stream, to generate a selection bit stream; and
a second multiplexer (MUX) unit which changes an order of the selection bit stream to generate an output bit stream.

2. The bit interleaver of claim 1, further comprising:
a register which stores a portion of bits of a previous bit stream output from the memory, a clock before the bit stream is output from the memory; and
a third MUX unit which selects one of an output of the register and a portion of output bits of the second MUX unit to generate the output bit stream.

3. The bit interleaver of claim 2, wherein bits of the output bit stream correspond to indexes and first digits of the indexes are the same.

4. The bit interleaver of claim 3, wherein the memory outputs a bit stream of 10 bits, the delay devices correspond to 10 bits, and the first MUX unit comprises 10 multiplexers.

5. The bit interleaver of claim 4, wherein the first MUX unit selects bits of the delayed bit stream, when selecting either bits of the bit stream output from the memory or bits of the delayed bit stream with respect to bits corresponding to the bits stored in the register.

6. The bit interleaver of claim 5, wherein the bit interleaver outputs an output bit stream every clock for 20 clocks, and the first MUX unit and the second MUX unit operate based on a first control signal for 10 clocks from a first clock to a tenth clock, and operate based on a second control signal for another 10 clocks from an eleventh clock to a twentieth clock.

7. The bit interleaver of claim 6, wherein the clock corresponds to a nineteenth clock.

8. The bit interleaver of claim 7, wherein the third MUX unit generates a number of higher bits of the output bit stream by using a number of lower bits of the previous bit stream.

9. The bit interleaver of claim 8, wherein the number of bits is 3.

10. The bit interleaver of claim 8, wherein the number of bits is 8.

11. A bit interleaver comprising:
a plurality of delay devices which are provided with a bit stream output from a memory, the bit stream being symbol-interleaved and tone-interleaved, and delay a portion of bits of the bit stream output to generate a delayed bit stream;
a register which stores a portion of bits of a previous bit stream output from the memory, a clock before the bit stream is output from the memory, the previous bit stream being symbol-interleaved and the tone-interleaved; and
a multiplexer (MUX) unit which selects one of an output of the register and bits corresponding to a bit stream which is not delayed by the delay devices and output from the memory,
wherein the bit interleaver generates an output bit stream using the delay devices and an output of the MUX unit.

12. The bit interleaver of claim 11, wherein bits of the output bit stream correspond to indexes and first digits of the indexes are the same.

13. The bit interleaver of claim 12, wherein the bit steam output from the memory has 10 bits, and an addition of a number of bits corresponding to the delay devices and a number of bits corresponding to the register is 10.

14. The bit interleaver of claim 13, wherein the bit interleaver outputs an output bit stream for 20 clocks, and the MUX unit operates by a first control signal for 19 clocks from a first clock to a nineteenth clock, and operates by a second control signal for a twentieth clock.

15. The bit interleaver of claim 11, wherein the clock corresponds to a nineteenth clock.

16. The bit interleaver of claim 15, wherein the portion of the bits of the previous bit stream include bits not delayed in the delay devices among the bit stream output from the memory.

17. The bit interleaver of claim 16, wherein the MUX unit generates a number of higher bits of the output bit stream based on a same number of lower bits of the previous bit stream.

18. The bit interleaver of claim 17, wherein the same number of bits is 6.

19. The bit interleaver of claim 17, wherein the same number of bits is 2.

20. A bit interleaving method comprising:
    outputting from a memory a bit stream, the bit steam being symbol-interleaved and tone-interleaved;
    selecting one of a bit of the bit stream output from the memory and a bit of a delayed bit stream, which is acquired by delaying the bit stream, to generate a selection bit stream; and
    generating an output bit stream by changing an order of the selection bit stream.

21. The bit interleaving method of claim 20, further comprising:
    storing a portion of bits of a previous bit stream output from the memory, a clock before a bit stream is output from the memory, the previous bit stream being symbol-interleaved and tone-interleaved, and replacing a portion of bits of the output bit stream with the stored bits.

22. The bit interleaving method of claim 21, wherein the outputting outputs bits corresponding to indexes, having an identical number in first digits of the indexes, as the bit stream.

23. The bit interleaving method of claim 22, wherein the replacing generates a number of higher bits of the output bit stream based on a same number of lower bits of the previous bit stream.

24. A bit interleaving method comprising:
    outputting from a memory a bit stream, the bit stream being symbol-interleaved and tone-interleaved;
    generating a delayed bit stream by delaying a portion of bits of the bit stream output from the memory; and
    generating an output bit stream by storing a portion of bits of a previous bit stream output from the memory, a clock before the bit stream is output from the memory, the previous bit stream being symbol interleaved and tone-interleaved, and replacing a portion of bits of the output bit stream with the stored bits.

25. The bit interleaving method of claim 24, wherein the outputting outputs bits corresponding to indexes as the bit stream, and first digits of the indexes are the same.

26. The bit interleaving method of claim 25, wherein the bit stream output from the memory has 10 bits, and an addition of a number of the delayed bits and a number of the stored bits is 10.

27. The bit interleaving method of claim 25, wherein the generating the output bit stream generates a number of higher bits of the output bit stream based on a same number of lower bits of the previous bit stream.

* * * * *